(12) United States Patent
Yang et al.

(10) Patent No.: US 11,038,512 B2
(45) Date of Patent: Jun. 15, 2021

(54) PHASE-LOCKING APPARATUS AND PHASE-LOCKING METHOD

(71) Applicant: HUAWEI TECHNOLOGIES CO., LTD., Guangdong (CN)

(72) Inventors: Dongsheng Yang, Aalborg (DK); Fangcheng Liu, Shanghai (CN); Xiongfei Wang, Aalborg (DK)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/105,029

(22) Filed: Nov. 25, 2020

(65) Prior Publication Data

US 2021/0083679 A1     Mar. 18, 2021

Related U.S. Application Data

(63) Continuation of application No. PCT/CN2019/080687, filed on Mar. 30, 2019.

(30) Foreign Application Priority Data

May 31, 2018  (CN) .......................... 201810553555.7

(51) Int. Cl.
*H03L 7/091* (2006.01)
*H03L 7/099* (2006.01)

(52) U.S. Cl.
CPC .............. *H03L 7/091* (2013.01); *H03L 7/099* (2013.01)

(58) Field of Classification Search
CPC .................................. H03L 7/091; H03L 7/099
See application file for complete search history.

(56) References Cited

U.S. PATENT DOCUMENTS

| | | | | |
|---|---|---|---|---|
| 3,723,718 A | * | 3/1973 | Jaffe ........................ | G06G 7/63 703/4 |
| 4,095,255 A | * | 6/1978 | Groeneweg ............ | H03B 5/366 331/8 |
| 5,093,847 A | * | 3/1992 | Cheng ................ | H04L 27/3827 327/156 |
| 5,438,591 A | * | 8/1995 | Oie ..................... | H04L 27/3827 329/306 |

(Continued)

*Primary Examiner* — Adam D Houston
(74) *Attorney, Agent, or Firm* — Fish & Richardson P.C.

(57) ABSTRACT

Embodiments of this application provide a phase-locking apparatus and a phase-locking method. The phase-locking apparatus includes an amplitude adjustment unit, an amplitude and phase detector connected to the amplitude adjustment unit, a first loop filter connected to the amplitude and phase detector, a second loop filter connected to the amplitude and phase detector, a first oscillator connected to the first loop filter, and a second oscillator connected to the second loop filter. The amplitude adjustment unit, the amplitude and phase detector, the first loop filter, and the first oscillator form a loop; and the amplitude and phase detector, the second loop filter, and the second oscillator form another loop. According to the embodiments of this application, a dual-loop structure of the phase-locking apparatus can weaken frequency coupling between a positive-sequence component generated by the phase-locking apparatus and a negative-sequence component generated by the phase-locking apparatus.

20 Claims, 22 Drawing Sheets

(56) References Cited

U.S. PATENT DOCUMENTS

| | | | | |
|---|---|---|---|---|
| 6,038,268 | A * | 3/2000 | Kawai | H04L 27/1525 329/300 |
| 6,194,929 | B1 * | 2/2001 | Drost | H03L 7/0812 327/156 |
| 6,232,835 | B1 * | 5/2001 | Braithwaite | H03F 1/3247 330/149 |
| 8,077,806 | B2 * | 12/2011 | Nawa | H04L 27/2273 375/326 |
| 8,866,519 | B1 * | 10/2014 | Hiebert | H03L 7/081 327/156 |
| 9,929,668 | B1 * | 3/2018 | Chen | H02J 3/1814 |
| 2005/0089120 | A1 * | 4/2005 | Quinlan | H04L 27/1525 375/335 |
| 2005/0143036 | A1 * | 6/2005 | Nair | H04L 27/2272 455/260 |
| 2006/0006829 | A1 * | 1/2006 | Anghel | H02P 9/009 318/719 |
| 2006/0120267 | A1 * | 6/2006 | De Bart | H04L 27/2647 370/208 |
| 2008/0212706 | A1 * | 9/2008 | Nakahara | H04L 27/206 375/267 |
| 2010/0239039 | A1 * | 9/2010 | Takai | H04B 7/2662 375/267 |
| 2011/0051780 | A1 * | 3/2011 | Kawasaki | H04L 27/365 375/135 |
| 2011/0075581 | A1 * | 3/2011 | Mihota | H04B 7/0682 370/252 |
| 2012/0051109 | A1 * | 3/2012 | Kim | H02M 1/083 363/127 |
| 2015/0123581 | A1 * | 5/2015 | Omata | B60L 15/20 318/400.17 |
| 2015/0381187 | A1 * | 12/2015 | Ahmed | H02J 3/48 327/156 |
| 2016/0109265 | A1 * | 4/2016 | Ishida | H02P 21/24 324/207.25 |
| 2017/0054294 | A1 * | 2/2017 | Lyu | H02M 1/15 |
| 2017/0201201 | A1 * | 7/2017 | Aoki | G01R 19/0092 |
| 2017/0288741 | A1 * | 10/2017 | Zhu | H04B 5/02 |
| 2018/0013434 | A1 * | 1/2018 | Amirkhany | H03L 7/101 |
| 2018/0254883 | A1 * | 9/2018 | Mitsugi | G06K 7/10366 |
| 2019/0131904 | A1 * | 5/2019 | Aoki | H02M 1/08 |

* cited by examiner

PHASE-LOCKING APPARATUS AND PHASE-LOCKING METHOD

CROSS-REFERENCE TO RELATED APPLICATIONS

This application is a continuation of International Application No. PCT/CN2019/080687, filed on Mar. 30, 2019, which claims priority to Chinese Patent Application No. 201810553555.7, filed on May 31, 2018. The disclosures of the aforementioned applications are hereby incorporated by reference in their entireties.

TECHNICAL FIELD

This application relates to the field of basic electronic circuit technologies, and in particular, to a phase-locking apparatus and a phase-locking method.

BACKGROUND

A phase locking technology is an automatic feedback control technology widely used in communications, navigation, broadcast and television communications, instrument and meter measurement, digital signal processing, and other technologies, and is used to implement mutual synchronization between different devices. FIG. 1 is a schematic structural diagram of a typical three-phase grid-tied converter. An alternating-current port of each grid-tied converter is connected to a point of common coupling (Point of Common Coupling, PCC) by using a filter of the grid-tied converter, so as to perform power transmission with a power grid ($Z_g$ is an equivalent power grid impedance from the PCC point to a remote infinite power grid). A phase-locked loop (Phase locked loop, PLL) in the grid-tied converter is configured to obtain a phase θ in alternating-current voltages ($v_a$, $v_b$, and $v_c$) at the PCC, and input the phase θ to a current controller of the grid-tied converter, so as to control the converter based on the phase θ. Control performed based on the phase θ includes power factor control, islanding detection, and the like.

A most common phase-locked loop is a synchronous reference frame phase-locked loop (Synchronous Reference Frame PLL, SRF-PLL). As shown in FIG. 2, the phase-locked loop includes a phase detector, a loop filter, and a voltage-controlled oscillator. A principle of obtaining, by the phase-locked loop, a phase θ required for control is as follows: First, coordinate transformation is performed on alternating-current voltages ($v_a$, $v_b$, and $v_c$) obtained from a PCC, to obtain two phase voltage signals $v_\alpha$ and $v_\beta$ in a stationary reference frame, where a phase difference between the two phase voltage signals is 90°. Then, coordinate transformation is performed on $v_\alpha$ and $v_\beta$ by using the phase detector, to obtain a quadrature-axis (also referred to as a q-axis) signal $v_q$ and a direct-axis (also referred to as a d-axis) signal $v_d$ in a rotating reference frame, where a reference phase used during the transformation is a phase estimate $\theta_0$ output by the SRF-PLL. Then, the quadrature-axis signal $v_q$ is filtered by the loop filter, to implement precision control and speed control. Next, output of the loop filter and a preset initial frequency wo are superposed and input to the voltage-controlled oscillator, and the voltage-controlled oscillator performs integral processing to obtain the phase estimate $\theta_0$. Then the phase estimate $\theta_0$ is used as the phase θ for control. It can be learned that the SRF-PLL may obtain the relatively ideal phase estimate $\theta_0$ through feedback adjustment. However, frequency coupling easily occurs in a structure of the SRF-PLL.

SUMMARY

Embodiments of this application disclose a phase-locking apparatus and a phase-locking method, to weaken, to some extent, frequency coupling between a positive-sequence component generated by the phase-locking apparatus and a negative-sequence component generated by the phase-locking apparatus.

According to a first aspect, an embodiment of this application provides a phase-locking apparatus. The phase-locking apparatus includes an amplitude adjustment unit, an amplitude and phase detector connected to the amplitude adjustment unit, a first loop filter connected to the amplitude and phase detector, a second loop filter connected to the amplitude and phase detector, a first oscillator connected to the first loop filter, and a second oscillator connected to the second loop filter. The amplitude adjustment unit is configured to compensate for a first alternating-current voltage signal based on an amplitude adjustment amount output by the first oscillator, to obtain a second alternating-current voltage signal, where the first alternating-current voltage signal is an alternating-current voltage signal from an alternating-current connection point, and the alternating-current connection point is an access point configured to access an alternating-current system. The amplitude and phase detector is configured to: determine an amplitude difference based on the second alternating-current voltage signal and a preset reference voltage amplitude, and determine a phase difference based on the second alternating-current voltage signal and a phase estimate output by the second oscillator. The amplitude and phase detector is further configured to output the amplitude difference to the first loop filter and output the phase difference to the second loop filter. The amplitude difference is used to represent an offset of an amplitude of the second alternating-current voltage signal relative to the reference voltage amplitude, and the phase difference is used to represent an offset of a phase of the second alternating-current voltage signal relative to the phase estimate. The first loop filter is configured to filter the input amplitude difference to obtain an amplitude control amount, and the second loop filter is configured to filter the input phase difference to obtain a phase control amount. The first oscillator is configured to convert the amplitude control amount output by the first loop filter to obtain the amplitude adjustment amount, and the second oscillator is configured to convert the phase control amount output by the second filter to obtain the phase estimate.

It can be learned that the amplitude adjustment unit, the amplitude and phase detector, the first loop filter, and the first oscillator form a loop of the phase-locking apparatus; and the amplitude and phase detector, the second loop filter, and the second oscillator form another loop of the phase-locking apparatus. The two loops of the phase-locking apparatus form a symmetric structure, and suppress generation of a negative-sequence component. Therefore, frequency coupling between a positive-sequence component generated by the phase-locking apparatus and a negative-sequence component generated by the phase-locking apparatus can be weakened. In addition, because the amplitude adjustment amount output by the first oscillator plays a feedback adjustment function on an amplitude of a voltage signal input to the phase-locking apparatus, an amplitude of a working voltage of the phase-locking apparatus can be kept relatively stable, thereby greatly improving working performance of the phase-locking apparatus.

With reference to the first aspect, in a first possible implementation of the first aspect, in the aspect of determining an amplitude difference based on the second alternating-current voltage signal and a preset reference voltage amplitude, and determining a phase difference based on the second alternating-current voltage signal and a phase estimate output by the second oscillator, the amplitude and phase detector is configured to: perform coordinate transformation on the second voltage signal based on the phase estimate output by the second oscillator, to obtain a direct-axis signal and a quadrature-axis signal in a rotating reference frame; and determine the amplitude difference based on the direct-axis signal and the preset reference voltage amplitude, and determine the phase difference based on the quadrature-axis signal.

With reference to the first aspect, in a second possible implementation of the first aspect, the amplitude and phase detector includes an amplitude detector and a phase detector. In the aspect of determining an amplitude difference based on the second alternating-current voltage signal and a preset reference voltage amplitude, and determining a phase difference based on the second alternating-current voltage signal and a phase estimate output by the second oscillator, the amplitude detector is configured to extract the amplitude of the second alternating-current voltage signal, and determine the amplitude difference based on the extracted amplitude and the preset reference voltage amplitude; and the phase detector is configured to extract the phase of the second alternating-current voltage signal or a phase of the first alternating-current voltage signal, and determine the phase difference based on the extracted phase and the phase estimate output by the second oscillator.

With reference to the first aspect, in a third possible implementation of the first aspect, in the aspects of that the first loop filter is configured to filter the input amplitude difference to obtain an amplitude control amount, and that the second loop filter is configured to filter the input phase difference to obtain a phase control amount, the first loop filter is specifically configured to filter out high-frequency interference from the input amplitude difference and perform scaling processing, to obtain the amplitude control amount; and the second loop filter is specifically configured to filter out high-frequency interference from the input phase difference and perform scaling processing, to obtain the phase control amount.

According to a second aspect, an embodiment of this application provides a phase-locking method. The phase-locking method is applied to a phase-locking apparatus. The phase-locking apparatus includes an amplitude adjustment unit, an amplitude and phase detector connected to the amplitude adjustment unit, a first loop filter connected to the amplitude and phase detector, a second loop filter connected to the amplitude and phase detector, a first oscillator connected to the first loop filter, and a second oscillator connected to the second loop filter. The method includes: compensating for a first alternating-current voltage signal based on an amplitude adjustment amount output by the first oscillator, to obtain a second alternating-current voltage signal, where the first alternating-current voltage signal is an alternating-current voltage signal from an alternating-current connection point, and the alternating-current connection point is an access point configured to access an alternating-current system; determining an amplitude difference based on the second alternating-current voltage signal and a preset reference voltage amplitude, and determining a phase difference based on the second alternating-current voltage signal and a phase estimate output by the second oscillator; outputting the amplitude difference to the first loop filter and outputting the phase difference to the second loop filter, where the amplitude difference is used to represent an offset of an amplitude of the second alternating-current voltage signal relative to the reference voltage amplitude, and the phase difference is used to represent an offset of a phase of the second alternating-current voltage signal relative to the phase estimate; filtering the input amplitude difference to obtain an amplitude control amount, and filtering the input phase difference to obtain a phase control amount; and converting the amplitude control amount output by the first loop filter to obtain the amplitude adjustment amount, and converting the phase control amount output by the second filter to obtain the phase estimate.

It can be learned that the amplitude adjustment unit, the amplitude and phase detector, the first loop filter, and the first oscillator form a loop of the phase-locking apparatus; and the amplitude and phase detector, the second loop filter, and the second oscillator form another loop of the phase-locking apparatus. The two loops of the phase-locking apparatus form a symmetric structure, and suppress generation of a negative-sequence component. Therefore, frequency coupling between a positive-sequence component generated by the phase-locking apparatus and a negative-sequence component generated by the phase-locking apparatus can be weakened. In addition, because the amplitude adjustment amount output by the first oscillator plays a feedback adjustment function on an amplitude of a voltage signal input to the phase-locking apparatus, an amplitude of a working voltage of the phase-locking apparatus can be kept relatively stable, thereby greatly improving working performance of the phase-locking apparatus.

With reference to the second aspect, in a first possible implementation of the second aspect, the determining an amplitude difference based on the second alternating-current voltage signal and a preset reference voltage amplitude, and determining a phase difference based on the second alternating-current voltage signal and a phase estimate output by the second oscillator includes: performing coordinate transformation on the second voltage signal based on the phase estimate output by the second oscillator, to obtain a direct-axis signal and a quadrature-axis signal in a rotating reference frame; and determining the amplitude difference based on the direct-axis signal and the preset reference voltage amplitude, and determining the phase difference based on the quadrature-axis signal.

With reference to the second aspect, in a second possible implementation of the second aspect, the determining an amplitude difference based on the second alternating-current voltage signal and a preset reference voltage amplitude, and determining a phase difference based on the second alternating-current voltage signal and a phase estimate output by the second oscillator includes: extracting the amplitude of the second alternating-current voltage signal, and determining the amplitude difference based on the extracted amplitude and the preset reference voltage amplitude; and extracting the phase of the second alternating-current voltage signal or a phase of the first alternating-current voltage signal, and determining the phase difference based on the extracted phase and the phase estimate output by the second oscillator.

With reference to the second aspect, in a third possible implementation of the second aspect, the filtering the input amplitude difference to obtain an amplitude control amount, and filtering the input phase difference to obtain a phase control amount includes: filtering out high-frequency interference from the input amplitude difference and performing scaling processing, to obtain the amplitude control amount; and filtering out high-frequency interference from the input phase difference and performing scaling processing, to obtain the phase control amount.

With reference to any one of the possible implementations of any one of the foregoing aspects, in still another possible implementation, in a third possible implementation of the first aspect, a first parameter configured for the first loop filter is the same as that configured for the second loop filter, and/or a second parameter configured for the first oscillator is the same as that configured for the second oscillator. The first parameter includes one or more of a ratio parameter, a low frequency gain, and a cut-off frequency, and the second parameter includes an integral coefficient. It can be understood that when the first parameter configured for the first loop filter is the same as that configured for the second loop filter, and/or the second parameter configured for the first oscillator is the same as that configured for the second oscillator, the two loops in the phase-locking apparatus have stronger symmetry, and can more effectively address frequency coupling.

With reference to any one of the possible implementations of any one of the foregoing aspects, in still another possible implementation, the first alternating-current voltage signal is an alternating-current voltage signal that is in a two-phase stationary reference frame and that is obtained by transforming three phase voltages collected at the alternating-current connection point.

With reference to any one of the possible implementations of any one of the foregoing aspects, in still another possible implementation, the first alternating-current voltage signal is an alternating-current voltage signal that is in a two-phase stationary reference frame and that is obtained by superposing two voltage signals into which a single phase voltage collected at the alternating-current connection point is split. One of the two voltage signals has undergone delay processing, and delay duration of the delay processing is ¼ of a utility frequency period.

With reference to any one of the possible implementations of any one of the foregoing aspects, in still another possible implementation, the first alternating-current voltage signal or the second alternating-current voltage signal is a positive-sequence component obtained through positive-sequence extraction. This can eliminate negative impact caused by a negative-sequence component.

With reference to any one of the possible implementations of any one of the foregoing aspects, in still another possible implementation, a ratio of the first alternating-current voltage signal to the second alternating-current voltage signal is in an exponential function relationship or a linear function relationship with the amplitude control amount output by the first oscillator.

According to a third aspect, an embodiment of this application provides a controller. The controller includes a phase-locking apparatus and a current control unit. The phase-locking apparatus is the phase-locking apparatus described in any one of the first aspect or the possible implementations of the first aspect. The current control unit is configured to output a control signal by using a phase parameter output by the phase-locking apparatus, where the control signal is used to control an alternating-current/direct-current converter to perform power conversion.

According to a fourth aspect, an embodiment of this application provides a grid-tied system. The grid-tied system includes an alternating-current/direct-current converter, and a controller connected to the alternating-current/direct-current converter. The controller includes a phase-locking apparatus and a current control unit. The phase-locking apparatus is the phase-locking apparatus described in any one of the first aspect or the possible implementations of the first aspect. The current control unit is configured to output a control signal by using a phase parameter output by the phase-locking apparatus, where the control signal is used to control the alternating-current/direct-current converter to perform power conversion.

According to a fifth aspect, an embodiment of this application provides a readable storage medium. The readable storage medium includes a program instruction. When the program instruction runs on a processor, the method described in any one of the second aspect or the possible implementations of the second aspect is implemented.

In the embodiments of this application, the amplitude adjustment unit, the amplitude and phase detector, the first loop filter, and the first oscillator form a loop of the phase-locking apparatus; and the amplitude and phase detector, the second loop filter, and the second oscillator form another loop of the phase-locking apparatus. The two loops of the phase-locking apparatus form a symmetric structure, thereby eliminating frequency coupling. In addition, because the amplitude adjustment amount output by the first oscillator plays a feedback adjustment function on an amplitude of a voltage signal input to the phase-locking apparatus, an amplitude of a working voltage of the phase-locking apparatus can be kept relatively stable, thereby greatly improving working performance of the phase-locking apparatus.

BRIEF DESCRIPTION OF DRAWINGS

The accompanying drawings used in the embodiments of the present invention are described as follows.

DESCRIPTION OF EMBODIMENTS

Figure 1:
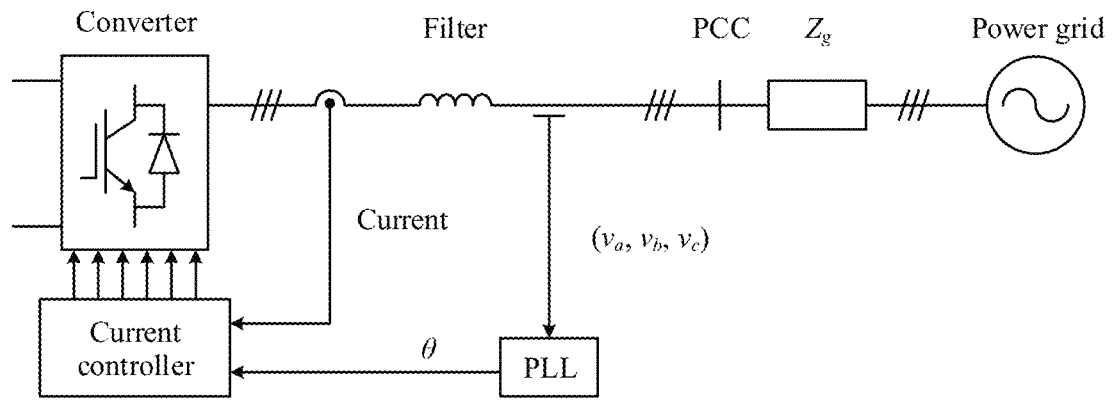
FIG. 1 is a schematic structural diagram of a three-phase grid-tied converter in the prior art.
Figure 2:
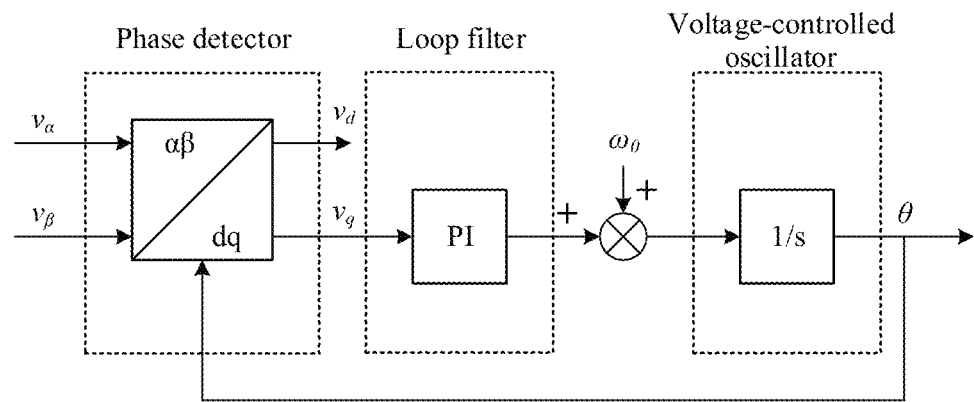
FIG. 2 is a schematic structural diagram of a phase-locked loop in a synchronous reference frame in the prior art.
Figure 3:
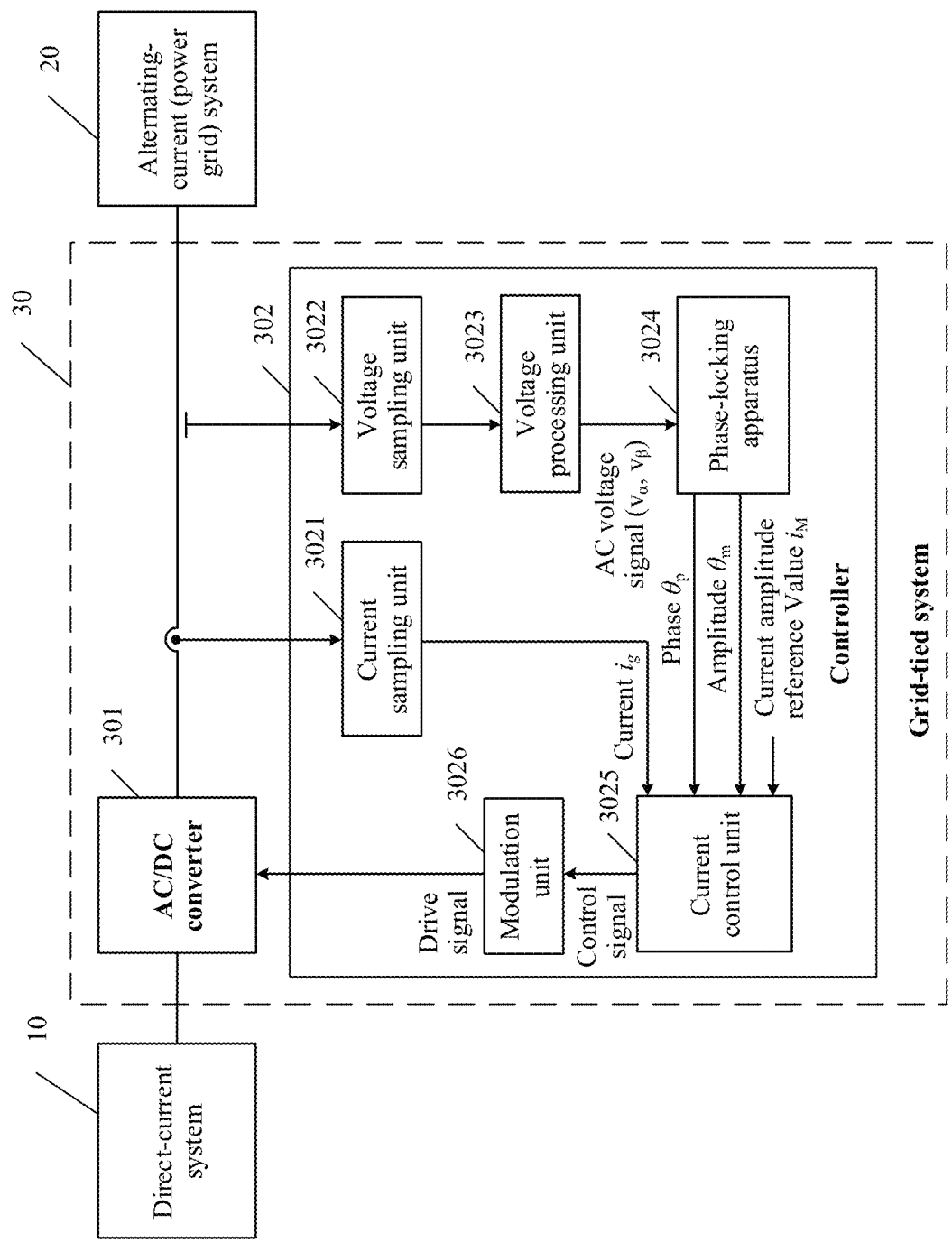
FIG. 3 is a schematic structural diagram of a grid-tied system according to an embodiment of this application.

FIG. 3 is a schematic structural diagram of a grid-tied system 30 according to an embodiment of this application. The grid-tied system (also referred to as an alternating-current/direct-current grid-tied system or a converter system) includes an alternating-current/direct-current converter 301 and a controller 302. The controller 302 is connected to the alternating-current/direct-current converter 301, and the controller 302 is configured to control the alternating-current/direct-current converter 301 to perform power conversion.

Figure 4:
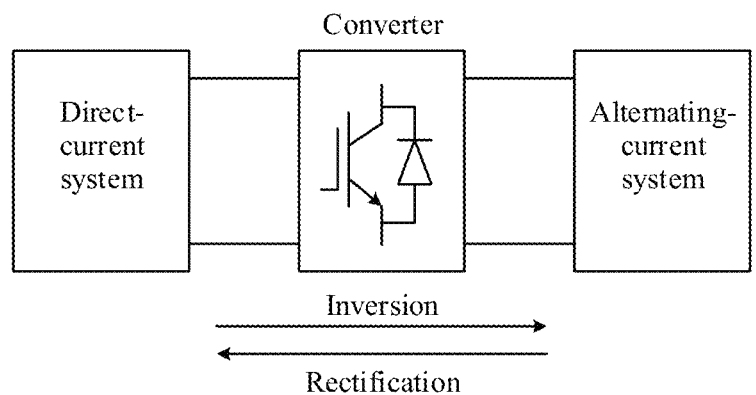
FIG. 4 is a schematic structural diagram of an alternating-current/direct-current converter according to an embodiment of this application.

The alternating-current/direct-current converter 301 is configured to connect a direct-current power system 10 and an alternating-current power system 20, and implement power transmission between the two power systems. If a power is transferred from the direct-current power system 10 to the alternating-current power system 20, this is referred to as an inverter mode. In this case, the alternating-current/direct-current converter 301 is also referred to as an inverter (Inverter). If a power is transferred from the alternating-current power system 20 to the direct-current power system 10, this is referred to as a rectifier mode. In this case, the alternating-current/direct-current converter 301 is also referred to as a rectifier (Rectifier). A structure of the alternating-current/direct-current converter 301 is shown in FIG. 4. To ensure stable power transmission, power control needs to be performed on the two power systems based on respective characteristics of the direct-current power system 10 and the alternating-current power system 20. For example, a voltage polarity of the direct-current power system 10 does not vary with time, and therefore an amplitude of a current transmitted by the direct-current power system 10 may be adjusted during power control. However, a magnitude and a polarity of a voltage and a current of the alternating-current power system 20 vary with time, and a basic alternating-current signal (including a voltage and a current) has three characteristic variables: an amplitude, a frequency, and a phase. Therefore, during power control, in addition to adjusting an amplitude of a current transmitted by the alternating-current power system 20, a frequency and a phase of the current also need to be controlled. That the alternating-current power system is "synchronous" means that a current frequency of the alternating-current power system 20 is controlled to be the same as a voltage frequency of the alternating-current power system 20, and a fixed phase difference is maintained between a current and a voltage.

Figure 5:
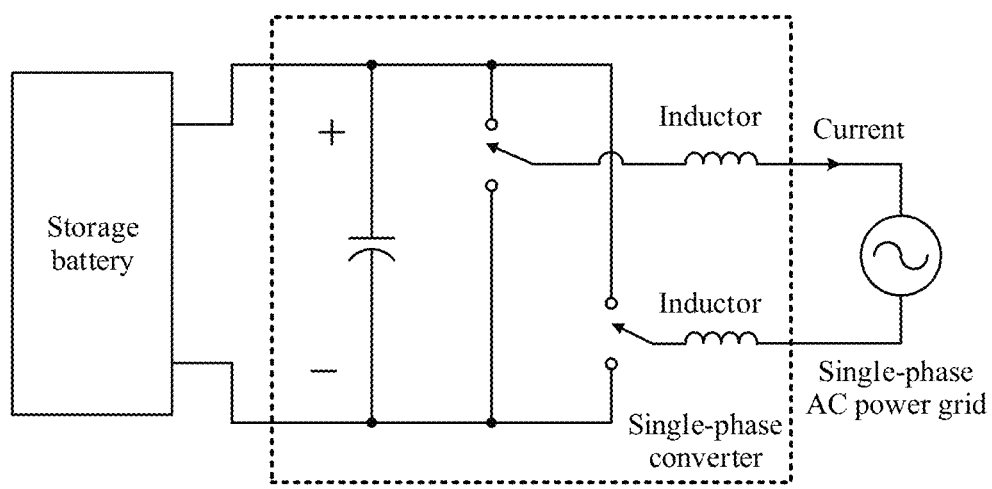
FIG. 5 is a schematic diagram of a scenario of a battery energy storage system according to an embodiment of this application.
Figure 6:
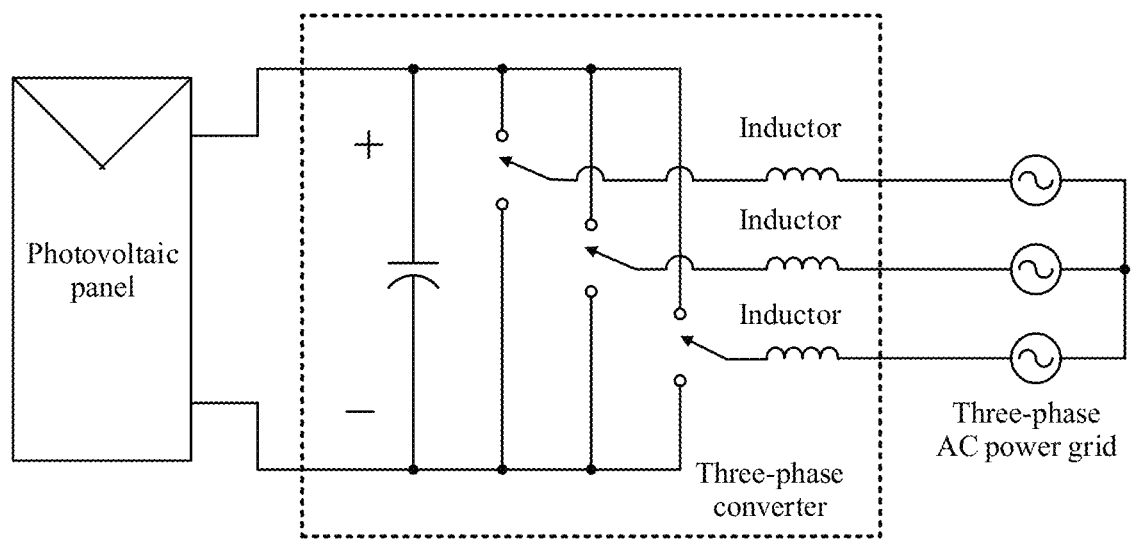
FIG. 6 is a schematic diagram of a scenario of a photovoltaic power generation system according to an embodiment of this application.

The alternating-current/direct-current converter 301 may include a single-phase converter and a three-phase converter, and both the single-phase converter and the three-phase converter need to keep the alternating-current power system "synchronous". Usually, a single-phase converter has a relatively small transmit power, and therefore is commonly used in a small-scale distributed power system, for example, a home power system or a battery energy storage system. A three-phase converter has a relatively large transmit power, and is commonly used in a large-scale power system, for example, a large-scale wind power generation system or a photovoltaic power generation system. FIG. 5 shows a battery energy storage system. FIG. 6 shows a photovoltaic power generation system. It should be noted that a hardware structure of the alternating-current/direct-current converter 301 in the rectifier mode is the same as that in the inverter mode. Using a scenario shown in FIG. 5 as an example, charging and discharging of the battery energy storage system correspond to the rectifier mode and the inverter mode respectively, but a charging process and a discharging process of the battery energy storage system depend on a same hardware structure. Therefore, this embodiment of this application is not limited to a specific mode. In addition, a scale of a power grid in this embodiment of this application is not limited, and the power grid may be a large power grid, or may be a micro grid that independently supplies power.

The controller 302 includes a current sampling unit 3021, a voltage sampling unit 3022, a voltage processing unit 3023, a phase-locking apparatus 3024, a current control unit 3025, and a modulation unit 3026. The current sampling unit 3021 is configured to connect to the current control unit 3025. The voltage sampling unit 3022 is configured to connect to the voltage processing unit 3023. The voltage processing unit 3023 is configured to connect to the phase-locking apparatus 3024. The phase-locking apparatus 3024 is configured to connect to the current control unit 3025. The current control unit 3025 is configured to connect to the modulation unit 3026. The units or apparatuses are described as follows:

The current sampling unit 3021 is configured to collect a current signal $i_g$ from an alternating-current side of a main circuit of the alternating-current/direct-current converter 301, and input the collected current signal $i_g$ to the current control unit 3025. The voltage sampling unit 3022 is configured to collect a voltage signal from the alternating-current side of the main circuit of the alternating-current/direct-current converter 301, and input the collected voltage signal to the voltage processing unit 3023.

Both input and output of the voltage processing unit 3023 are voltage signals, and the voltage processing unit 3023 is configured to perform a function such as positive-sequence extraction or coordinate transformation. The positive-sequence extraction function is to extract a positive-sequence component in a sampled voltage signal, to suppress interference of a harmonic component and a negative-sequence component. The coordinate transformation is to convert a single-phase or three-phase voltage signal into a signal in a two-phase stationary reference frame, to match input of the phase-locking apparatus.

The phase-locking apparatus 3024 is configured to generate an amplitude $n_m$ and a phase $\theta_p$ of a current based on an input voltage signal. In addition, a current amplitude reference value $i_M$ output by the phase-locking apparatus 3024 to the current control unit 3025 is input by an external element to the phase-locking apparatus 3024 or is directly configured in the phase-locking apparatus 3024 by using a program.

The current control unit 3025 is configured to adjust, based on the current amplitude reference value $i_M$ and the phase $\theta_p$ and the amplitude $\theta_m$ that are generated by the phase-locking apparatus 3024, the current signal $i_g$ collected by the current sampling unit 3021, to generate a control signal.

The modulation unit 3026 converts the control signal into a semiconductor switch drive signal that matches the alternating-current/direct-current converter 301, to directly control an on/off state of a semiconductor in the alternating-current/direct-current converter 301, thereby implementing control over the alternating-current/direct-current converter 301.

It should be noted that a structure of the phase-locking apparatus 3024 and a working principle of the phase-locking apparatus 3024 are mainly described in the embodiments of this application.

Figure 7:
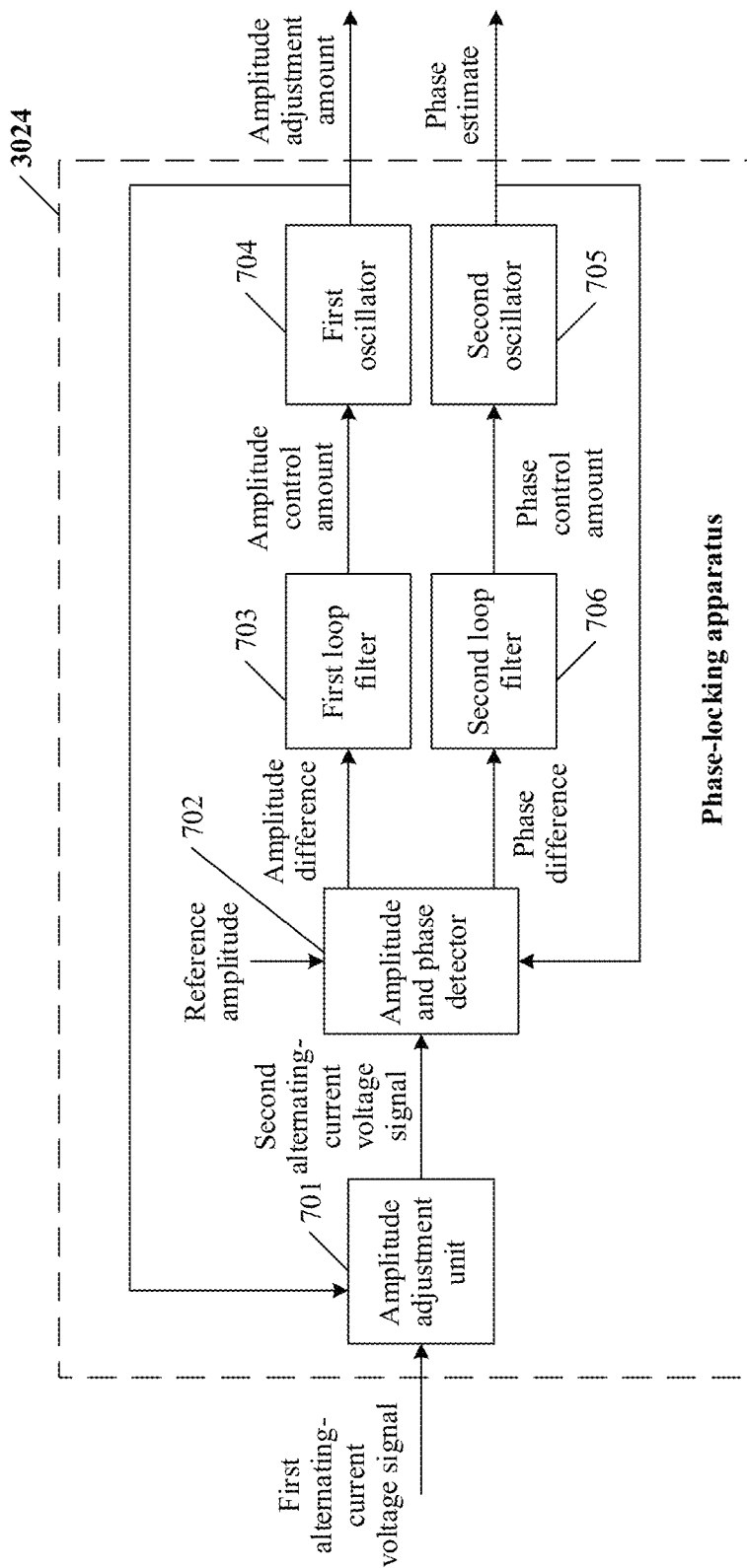
FIG. 7 is a schematic structural diagram of a phase-locking apparatus according to an embodiment of this application.

FIG. 7 is a schematic structural diagram of a phase-locking apparatus 3024 according to an embodiment of this application. The phase-locking apparatus 3024 includes an amplitude adjustment unit 701, an amplitude and phase detector 702, a first loop filter 703, a second loop filter 706, a first oscillator 704, and a second oscillator 705. An input end of the amplitude adjustment unit 701 is connected to an output end of the first oscillator 704. An output end of the amplitude adjustment unit 701 is connected to an input end of the amplitude and phase detector 702. The input end of the amplitude and phase detector 702 is connected to an output end of the second oscillator 705. An output end of the amplitude and phase detector 702 is connected to an input end of the first loop filter 703 and an input end of the second loop filter 706. An output end of the first loop filter 703 is connected to an input end of the first oscillator 704. An output end of the second loop filter 706 is connected to an input end of the second oscillator 705.

Figure 8:
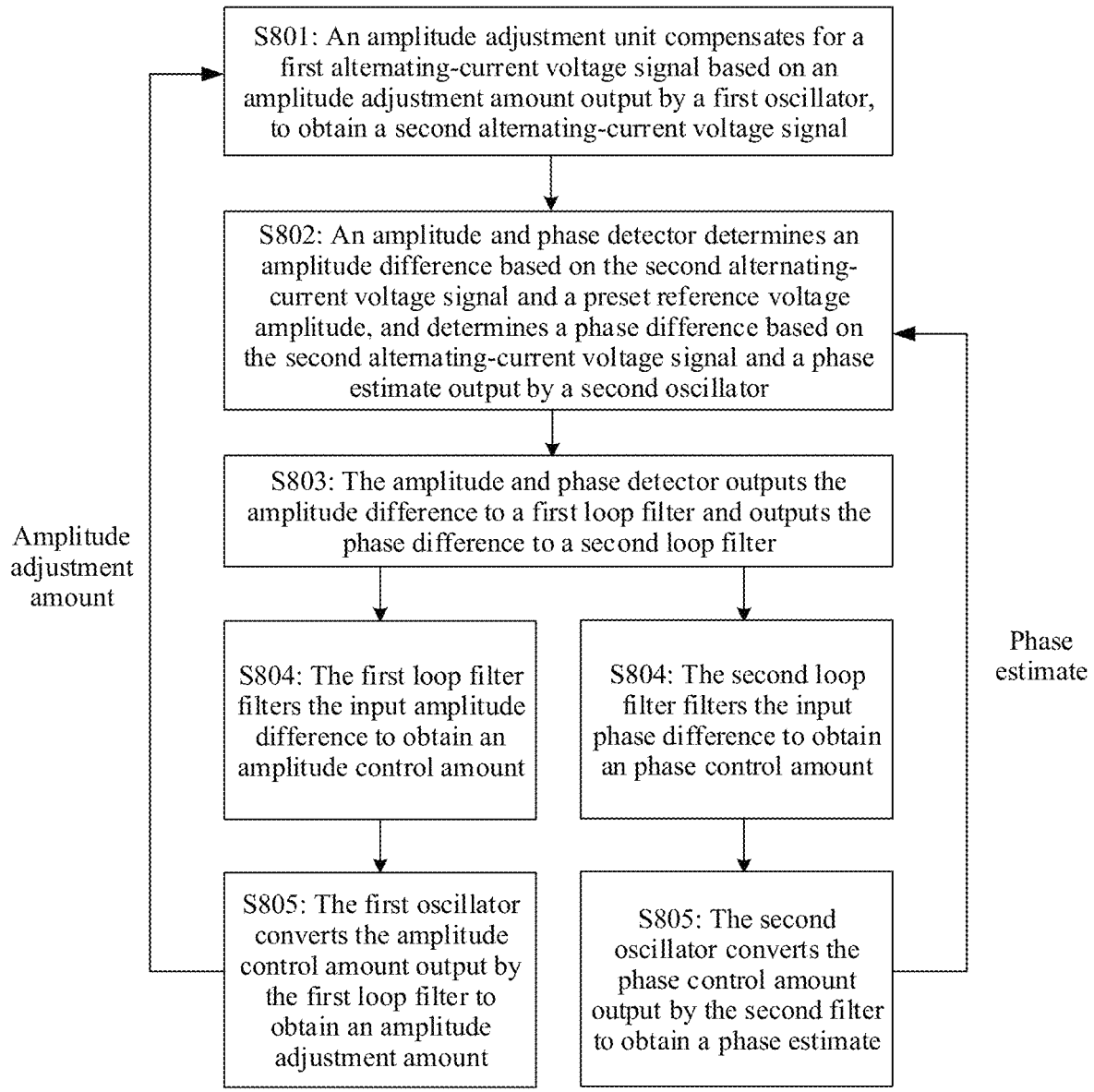
FIG. 8 is a schematic flowchart of a phase-locking method according to an embodiment of this application.

FIG. 8 is a schematic flowchart of a phase-locking method according to an embodiment of this application. The process may be implemented based on the phase-locking apparatus 3024 of the structure shown in FIG. 7. The method includes but is not limited to the following steps.

Step S801: The amplitude adjustment unit compensates for a first alternating-current voltage signal based on an amplitude adjustment amount output by the first oscillator, to obtain a second alternating-current voltage signal.

Figure 9:
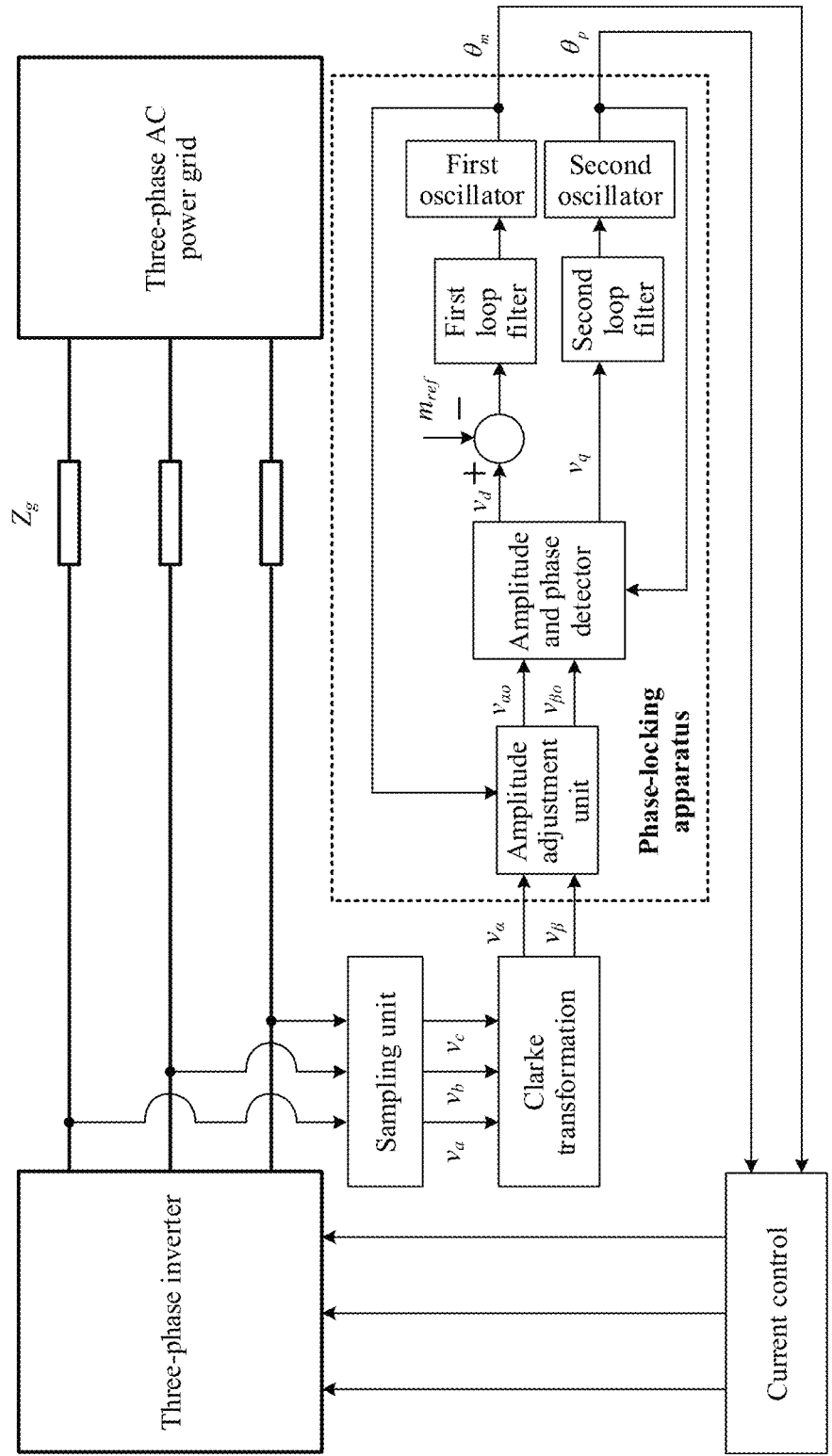
FIG. 9 is a schematic diagram of a scenario of a three-phase grid-tied converter system according to an embodiment of this application.
Figure 10:
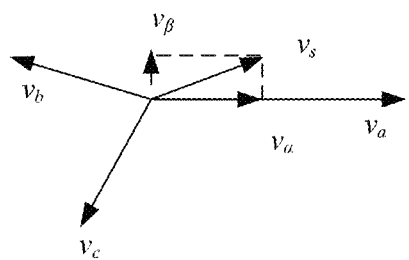
FIG. 10 is a schematic diagram of a principle of Clarke transformation according to an embodiment of this application.

Specifically, a feedback adjustment loop is formed between the first oscillator and the amplitude adjustment unit, the amplitude adjustment amount output by the first oscillator is input to the amplitude adjustment unit in turn to compensate for the first alternating-current voltage signal, and a new amplitude adjustment amount may be subsequently obtained by performing a series of processing (a specific processing procedure is described in the following descriptions) on the second alternating-current voltage signal obtained through compensation. In addition, the first alternating-current voltage signal is an alternating-current voltage signal collected from an alternating-current connection point (for example, a point of common coupling (Point of Common Coupling, PCC)), or a voltage signal obtained by transforming an alternating-current voltage signal collected from the alternating-current connection point. The alternating-current connection point is an access point configured to access an alternating-current system. The following describes two possible cases of the first alternating-current voltage signal as examples:

First case: The first alternating-current voltage signal is an alternating-current voltage signal that is in a two-phase stationary reference frame and that is obtained by transforming three phase voltages collected at the alternating-current connection point. As shown in FIG. 9, the phase-locking apparatus is applied to a three-phase grid-tied converter system. A sampling unit in the three-phase grid-tied converter system collects three phase voltages $v_a$, $v_b$, and $v_c$, and obtains voltages ($v_\alpha$ and $v_\beta$) in the two-phase stationary reference frame by performing Clarke transformation on the three phase voltages. A basic principle of Clarke transformation is briefly described herein. As shown in FIG. 10, there are a voltage space vector $v_s$ and two reference frames. One reference frame is a three-phase stationary reference frame, including three axes: an a-axis, a b-axis, and a c-axis. An included angle between the three axes is 120°, and projections of $v_s$ on the three axes are $v_a$, $v_b$, and $v_c$. The other reference frame is a two-phase stationary reference frame, including two axes in total: an α-axis and a β-axis. The β-axis is perpendicular to the α-axis, and projections of $v_s$ on the two axes are $v_\alpha$ and $v_\beta$. Therefore, the Clarke transformation is to transform the projections $v_a$, $v_b$, and $v_c$ of the voltage space vector $v_s$ in the three-phase stationary reference frame into the projections $v_\alpha$ and $v_\beta$ in the two-phase stationary reference frame by using a mathematical relationship. A formula 1-1 is an optional mathematical equation used during the transformation:

$$\begin{bmatrix} v_\alpha \\ v_\beta \end{bmatrix} = \frac{2}{3} \begin{bmatrix} 1 & -\frac{1}{2} & -\frac{1}{2} \\ 0 & \frac{\sqrt{3}}{2} & -\frac{\sqrt{3}}{2} \end{bmatrix} * \begin{bmatrix} v_a \\ v_b \\ v_c \end{bmatrix} \qquad 1\text{-}1$$

Figure 11:
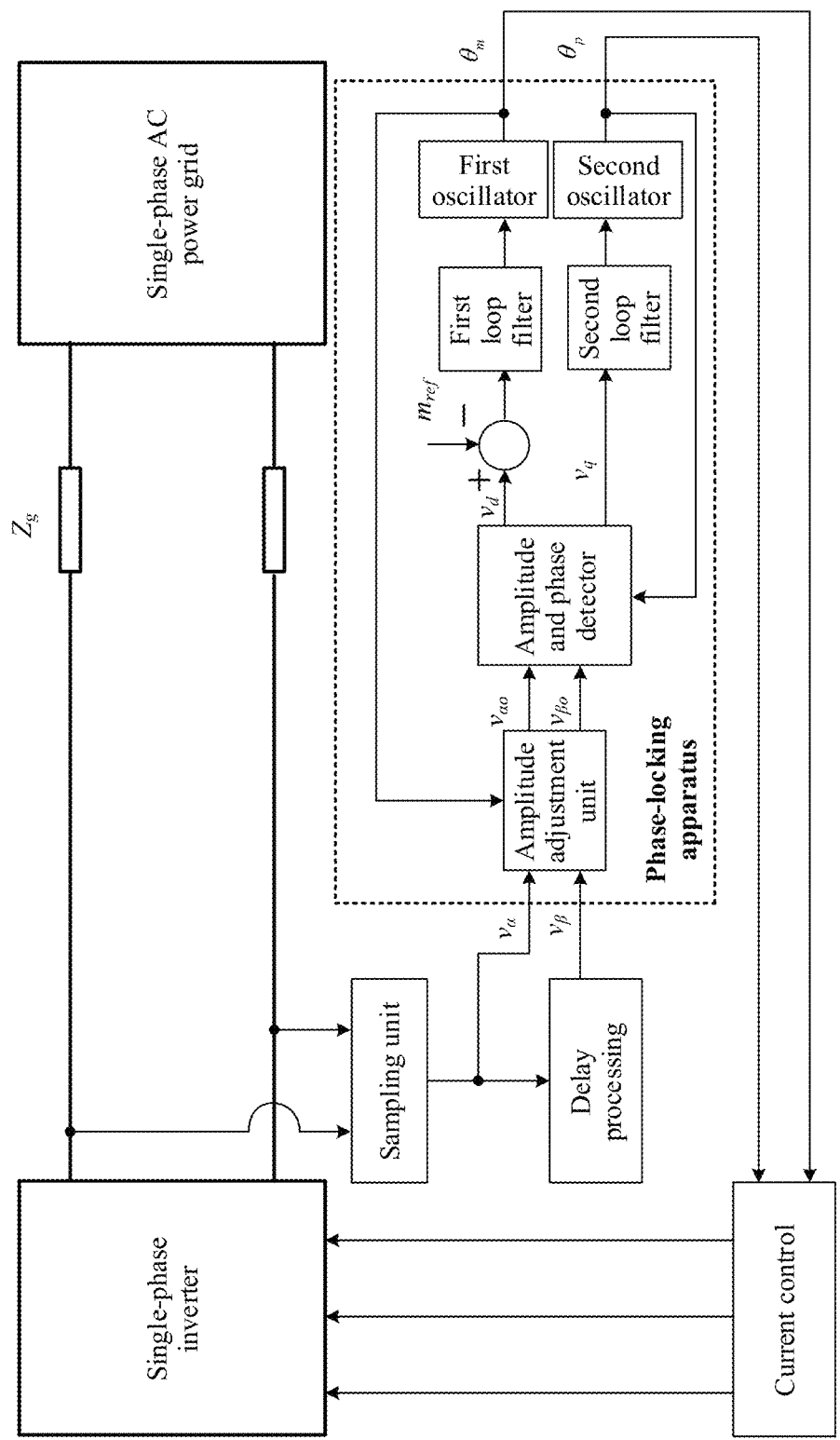
FIG. 11 is a schematic diagram of a scenario of obtaining two phase voltages according to an embodiment of this application.

Second case: The first alternating-current voltage signal is an alternating-current voltage signal that is in a two-phase stationary reference frame and that is obtained by superposing two voltage signals into which a single phase voltage collected at the alternating-current connection point is split. As shown in FIG. 11, one of the two voltage signals has undergone delay processing, and delay duration of the delay processing is ¼ of a utility frequency period. A basic idea is that an entire utility frequency period corresponds to 360°, and ¼ of the utility frequency period corresponds to 90°, and this can exactly satisfy a mathematical relationship that two coordinate axes of the two-phase stationary reference frame are perpendicular to each other at 90°. In this case, one of the two voltage signals that has not undergone delay processing is a voltage signal $v_\alpha$, the other voltage signal that has undergone delay processing is a voltage signal $v_\beta$, and the two voltage signals form the first alternating-current voltage signal ($v_\alpha$, $v_\beta$).

The foregoing describes an example of a manner of obtaining the first alternating-current voltage signal. The following describes how to compensate for the first alternating-current voltage signal based on the amplitude adjustment amount to obtain the second alternating-current voltage signal. Because an amplitude of the alternating-current voltage signal collected at the alternating-current connection point is affected by a power grid impedance $Z_g$ and a magnitude of a current flowing through $Z_g$, an amplitude of the first voltage signal ($v_\alpha$, $v_\beta$) obtained through transformation is also affected, and becomes unstable. Therefore, the amplitude adjustment unit adjusts the first alternating-current voltage signal based on the amplitude adjustment amount $\theta_m$ output by the first oscillator, so that an amplitude of the second voltage signal ($v_{\alpha 0}$, $v_{\beta 0}$) obtained through adjustment is stable in a relatively ideal interval. A manner of compensating for the first alternating-current voltage signal ($v_\alpha$, $v_\beta$) based on the amplitude adjustment amount $\theta_m$ to obtain the second alternating-current voltage signal ($v_{\alpha 0}$, $v_{\beta 0}$) may be as follows:

Manner 1: exponential implementation. For a specific gain relationship, refer to a formula 1-2:

$$\begin{bmatrix} v_{\alpha 0} \\ v_{\beta 0} \end{bmatrix} = (a^{-\theta_m}) * \begin{bmatrix} v_\alpha \\ v_\beta \end{bmatrix} \quad 1\text{-}2$$

where a is a preset constant greater than 0, for example, is set to e, and in this case, a gain relationship is shown in a formula 1-3:

$$\begin{bmatrix} v_{\alpha 0} \\ v_{\beta 0} \end{bmatrix} = (e^{-\theta_m}) * \begin{bmatrix} v_\alpha \\ v_\beta \end{bmatrix} \quad 1\text{-}3$$

Manner 2: fractional implementation. For a specific gain relationship, refer to a formula 1-4:

$$\begin{bmatrix} v_{\alpha 0} \\ v_{\beta 0} \end{bmatrix} = \frac{a - \theta_m}{a} * \begin{bmatrix} v_\alpha \\ v_\beta \end{bmatrix} \quad 1\text{-}4$$

where a is a preset constant greater than 0.

Figure 12:
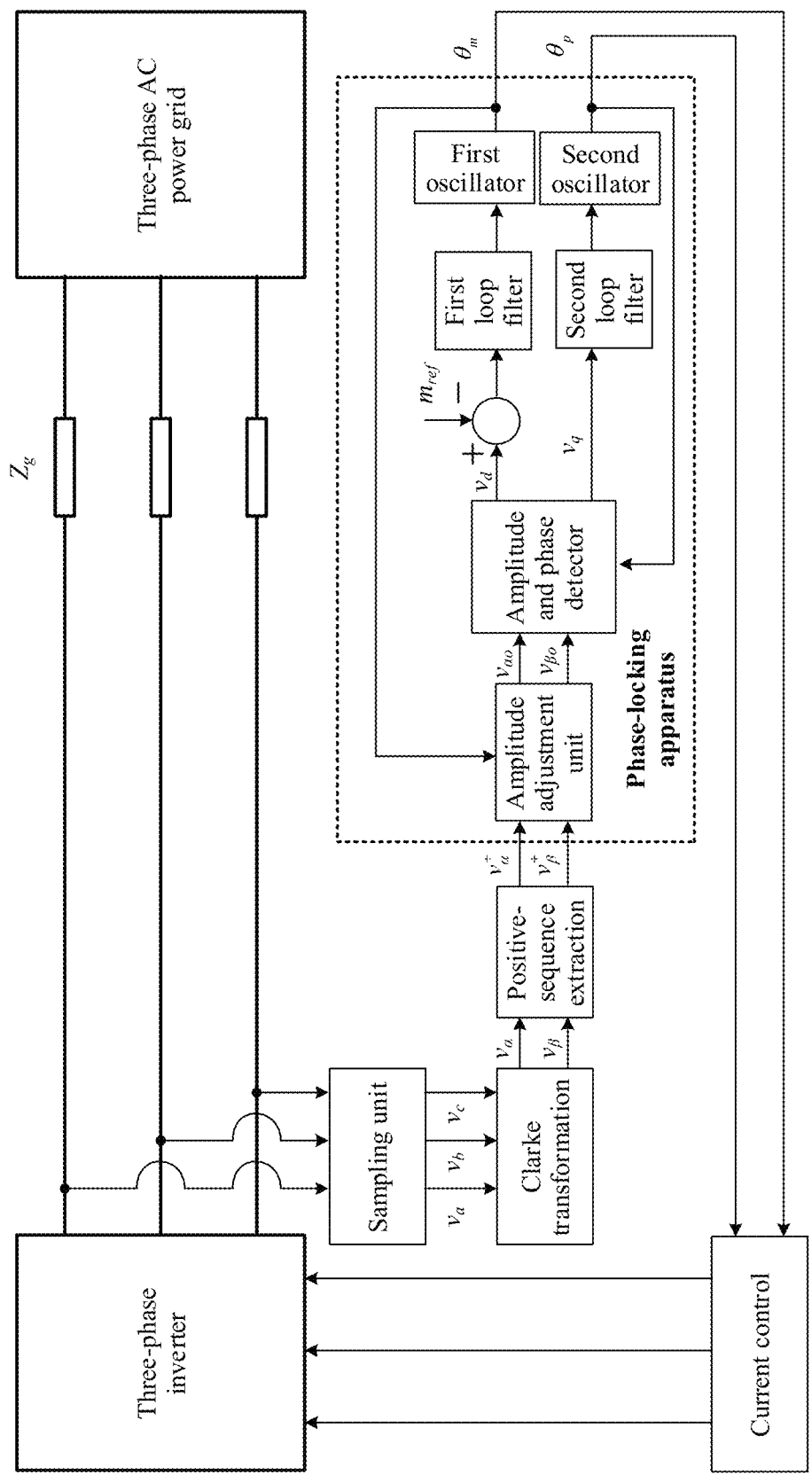
FIG. 12 is another schematic diagram of a scenario of obtaining two phase voltages according to an embodiment of this application.
Figure 13:
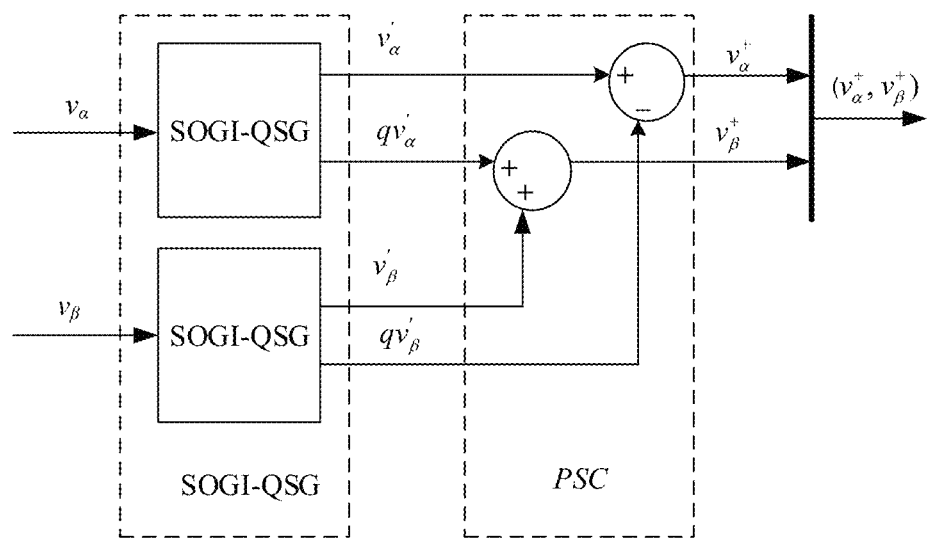
FIG. 13 is a schematic diagram of a scenario of positive-sequence extraction according to an embodiment of this application.

In an optional solution, the first alternating-current voltage signal or the second alternating-current voltage signal is a positive-sequence component obtained through positive-sequence extraction. This can eliminate negative impact caused by a negative-sequence component. As shown in FIG. 12, three phase voltages collected by a collection unit undergo Clarke transformation to obtain a first alternating-current voltage signal in a two-phase stationary reference frame. In a process of obtaining a second alternating-current voltage signal based on the first alternating-current voltage signal, positive-sequence extraction is first performed on the first alternating-current voltage signal to obtain a positive-sequence component, and then the positive-sequence component of the first alternating-current voltage signal is compensated for by using the amplitude adjustment amount output by the first oscillator, to obtain the second alternating-current voltage signal. Therefore, in this case, the second alternating-current voltage signal is a positive-sequence component obtained through positive-sequence extraction. Currently, a dual second-order generalized integrator quadrature signal generator (DSOGI-QSG) and a positive sequence calculator (Positive Sequence Calculator, PSC) are usually used to extract a positive-sequence component. FIG. 13 is a schematic diagram of positive-sequence extraction. The first alternating-current voltage signal ($v_\alpha$, $v_\beta$) and the positive-sequence component ($v_\alpha^+$, $v_\beta^+$) of the first alternating-current voltage signal satisfy mathematical relationships shown in formulas 1-5 and 1-6:

$$\begin{bmatrix} v'_\alpha & qv'_\alpha \\ v'_\beta & qv'_\beta \end{bmatrix} = \begin{bmatrix} \dfrac{k\omega s}{s^2 + k\omega s + \omega^2} & \dfrac{k\omega^2}{s^2 + k\omega s + \omega^2} \end{bmatrix} \cdot \begin{bmatrix} v_\alpha \\ v_\beta \end{bmatrix} \quad 1\text{-}5$$

$$\begin{cases} v_\alpha^+ = v'_\alpha - qv'_\beta \\ v_\beta^+ = v'_\beta + qv'_\alpha \end{cases} \quad 1\text{-}6$$

where k is a damping ratio of a second-order generalized integrator, $\omega$ is a resonance frequency, and s is a complex frequency, and is a characteristic variable generated by performing Laplace transform on a time-domain function in a classical control theory.

Then the amplitude adjustment unit outputs the second alternating-current voltage signal ($v_{\alpha 0}$, $v_{\beta 0}$) to the amplitude and phase detector.

Step S802: The amplitude and phase detector determines an amplitude difference based on the second alternating-current voltage signal and a preset reference voltage amplitude, and determines a phase difference based on the second alternating-current voltage signal and a phase estimate output by the second oscillator.

Specifically, the amplitude difference may be calculated based on an amplitude of the second alternating-current voltage signal and the preset reference voltage amplitude. The amplitude difference is used to represent an offset of the amplitude of the second alternating-current voltage signal relative to the reference voltage amplitude. Optionally, the preset reference voltage amplitude may be a rated voltage value of an alternating-current power system connected to the phase-locking apparatus. In addition, a feedback adjustment loop is formed between the second oscillator and the amplitude and phase detector. The phase estimate output by the second oscillator is input to the amplitude and phase detector, and then the amplitude and phase detector calculates the phase difference based on a phase of the second alternating-current voltage signal and the phase estimate. The phase difference is used to represent an offset of the phase of the second alternating-current voltage signal relative to the phase estimate. The following describes several optional solutions for determining the amplitude difference and the phase difference by the amplitude and phase detector as examples.

In a first optional solution, the determining, by the amplitude and phase detector, an amplitude difference based on the second alternating-current voltage signal and the preset reference voltage amplitude, and determining a phase difference based on the second alternating-current voltage signal and a phase estimate output by the second oscillator may include: performing, by the amplitude and phase detector, coordinate transformation on the second voltage signal ($v_{\alpha 0}$, $v_{\beta 0}$) based on the phase estimate $\theta_p$ output by the second oscillator, to obtain a direct-axis signal $v_d$ and a quadrature-axis signal $v_q$ in a rotating reference frame. A formula 1-7 shows a possible mathematical relationship between the phase estimate $\theta_p$, the second voltage signal ($v_{\alpha 0}$, $v_{\beta 0}$), the direct-axis signal $v_d$, and the quadrature-axis signal $v_q$.

$$\begin{bmatrix} v_d \\ v_q \end{bmatrix} = \begin{bmatrix} \cos\theta_p & \sin\theta_p \\ -\sin\theta_p & \cos\theta_p \end{bmatrix} \cdot \begin{bmatrix} v_{\alpha o} \\ v_{\beta o} \end{bmatrix} \quad 1\text{-}7$$

According to a basic principle of a synchronous reference frame, it can be learned that, in a stable state, $v_d$ is related to an amplitude of a space vector $v_{s0}$ composed of ($v_{\alpha 0}$, $v_{\beta 0}$), and $v_q$ is equal to a phase difference between $\theta_p$ and $v_{s0}$. Therefore, the amplitude and phase detector further determines the amplitude difference $e_m$ based on the direct-axis signal $v_d$ and the preset reference voltage amplitude $m_{ref}$, and determines the phase difference $e_p$ based on the quadrature-axis signal $v_q$. The reference voltage amplitude $m_{ref}$ is a preset value used for reference comparison. A formula 1-8 shows a possible mathematical relationship between the direct-axis signal $v_d$, the reference voltage amplitude $m_{ref}$, and the amplitude difference $e_m$. A formula 1-9 shows a possible mathematical relationship between the quadrature-axis signal $v_q$ and the phase difference $e_p$.

$$e_m = v_d - m_{ref} \quad 1\text{-}8$$

$$e_p = v_q \quad 1\text{-}9$$

Figure 14A:
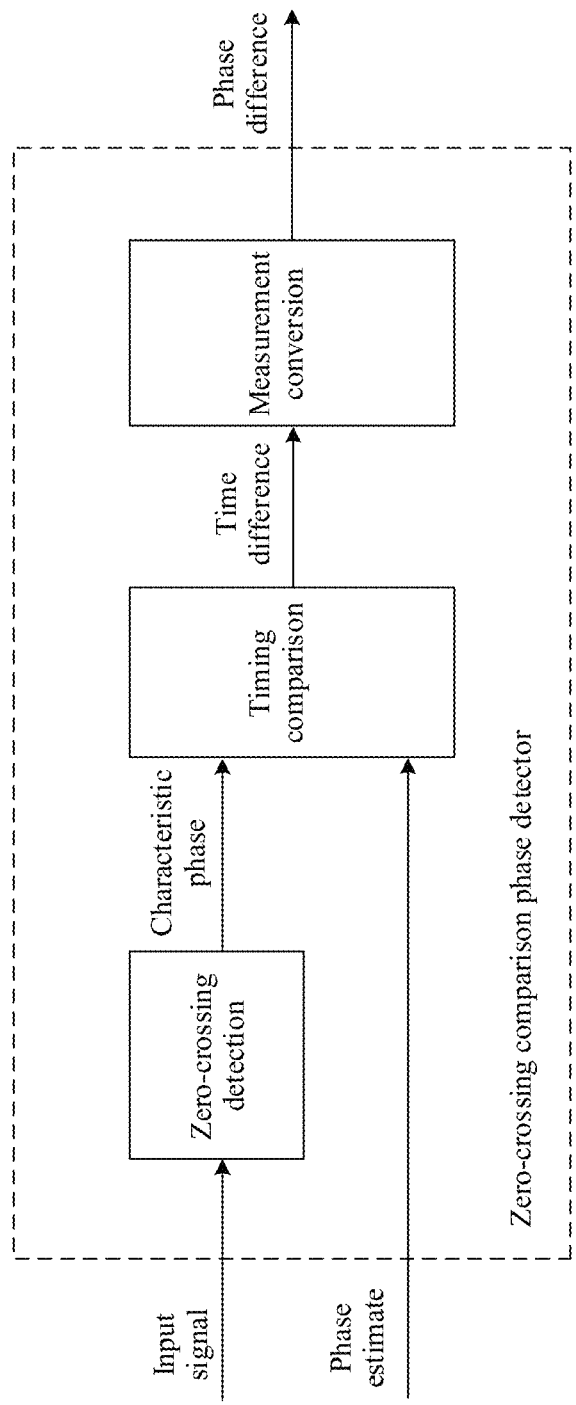
FIG. 14A is a schematic diagram of a scenario of determining a phase difference according to an embodiment of this application.
Figure 14B:
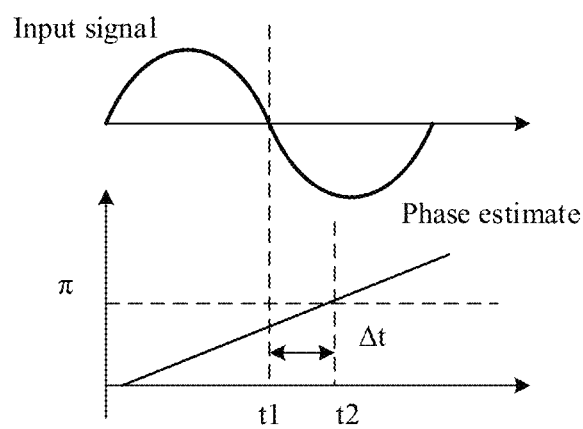
FIG. 14B is a schematic diagram of a principle of determining a phase difference according to an embodiment of this application.
Figure 15:
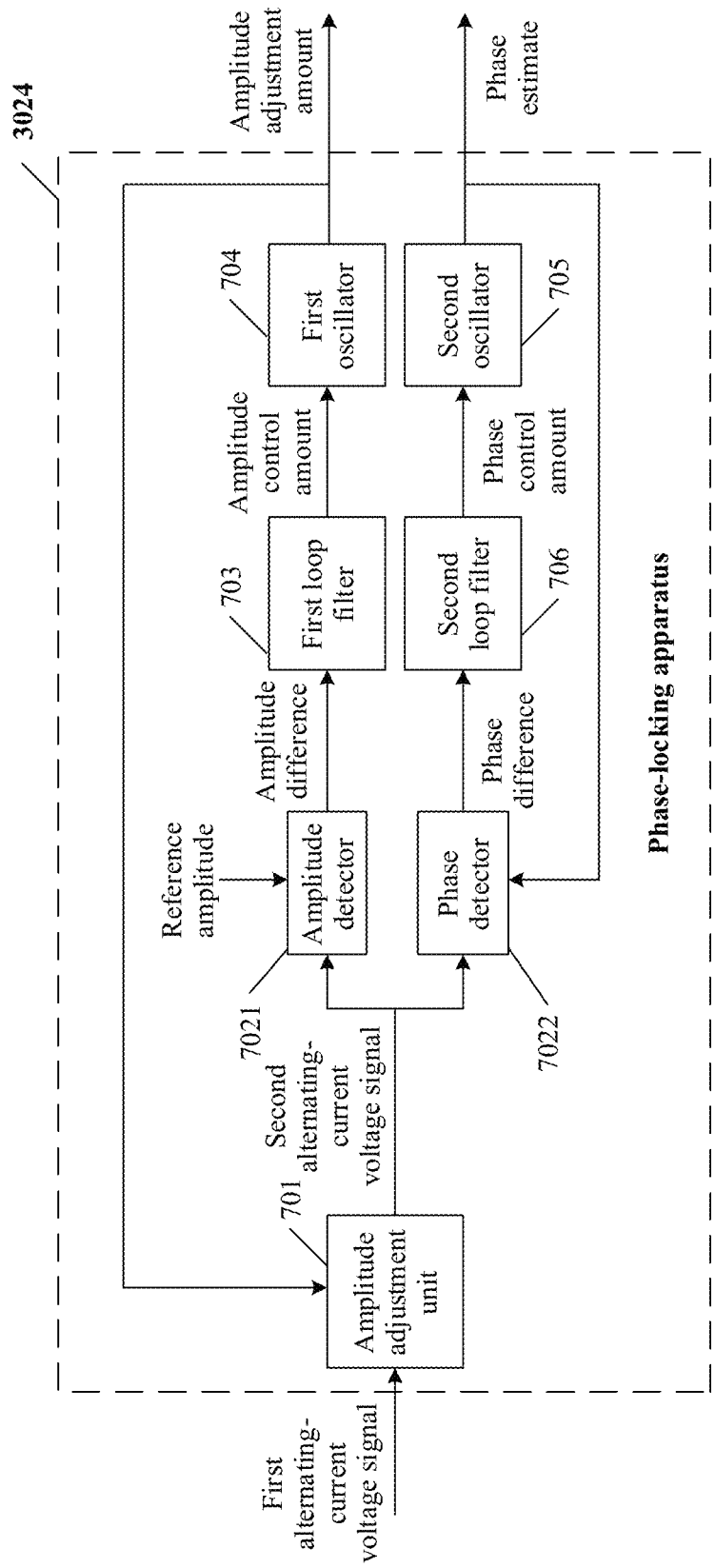
FIG. 15 is a schematic structural diagram of another phase-locking apparatus according to an embodiment of this application.
Figure 16:
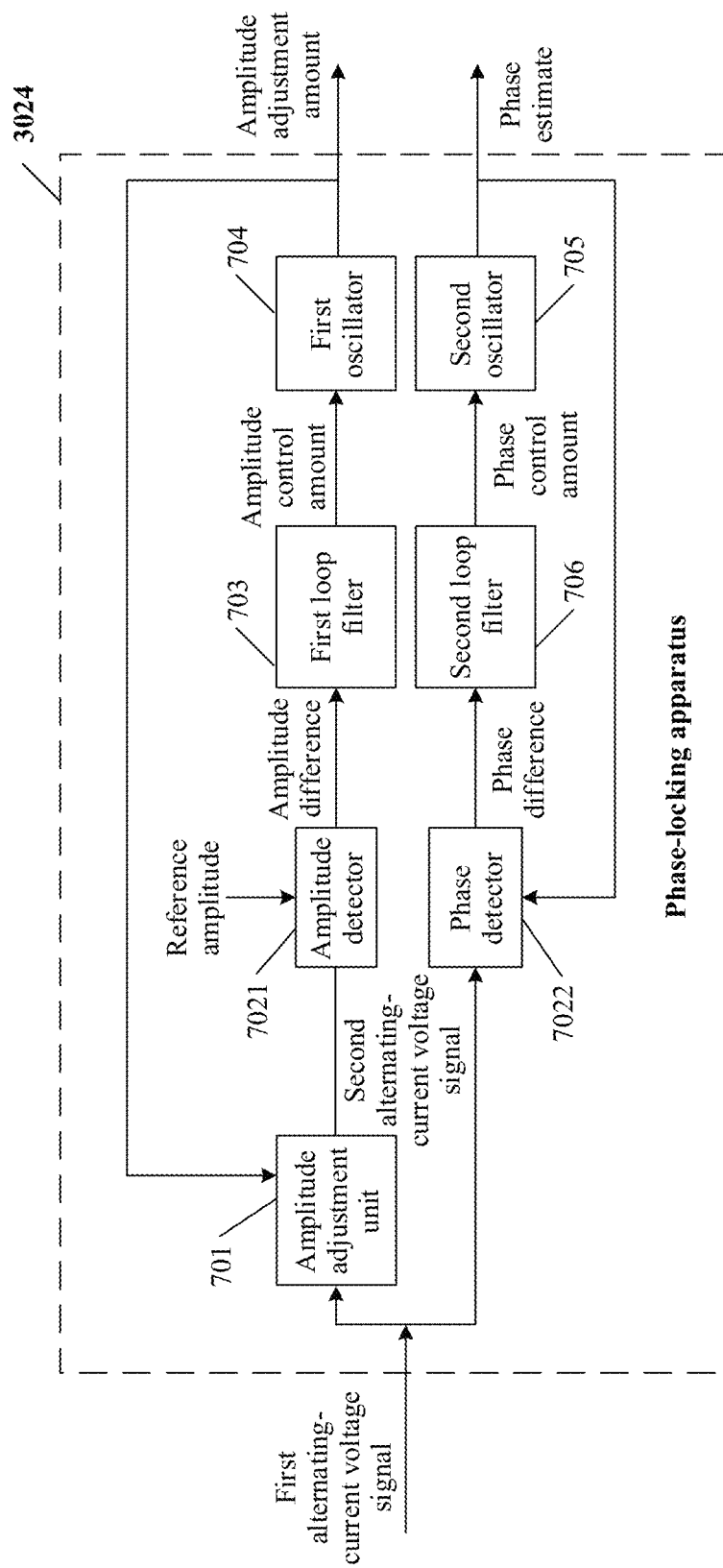
FIG. 16 is a schematic structural diagram of still another phase-locking apparatus according to an embodiment of this application.

In a second optional solution, the amplitude and phase detector 702 includes an amplitude detector 7021 and a phase detector 7022, that is, the amplitude detector 7021 is relatively independent of the phase detector 7022. In this case, the determining, by the amplitude and phase detector 702, an amplitude difference based on the second alternating-current voltage signal and the preset reference voltage amplitude, and determining a phase difference based on the second alternating-current voltage signal and a phase estimate output by the second oscillator 705 may include: extracting, by the amplitude detector 7021, an amplitude of the second alternating-current voltage signal, and determining the amplitude difference $e_m$ based on the extracted amplitude $v_n$ and the preset reference voltage amplitude $m_{ref}$, for example, $e_m = v_n - m_{ref}$; and extracting, by the phase detector 7022, a phase of the second alternating-current voltage signal or a phase of the first alternating-current voltage signal, and determining the phase difference based on the extracted phase and the phase estimate output by the second oscillator. For example, the phase detector performs comparison by using a signal zero-crossing point to determine the phase difference. As shown in FIG. 14A, a main function of the zero-crossing comparison phase detector is to obtain a characteristic phase of an input signal based on zero-crossing detection; then obtain, through timing comparison, a time difference $\Delta t$ between an occurrence time t1 of the characteristic phase and a time t2 at which a phase estimate is equal to the characteristic phase; and then convert, through measurement conversion, the time difference $\Delta t$ into the phase difference $\Delta \theta$ for output. Using FIG. 14B as an example, a characteristic phase corresponding to a moment at which an input signal crosses a zero point and changes from positive to negative is defined as $\pi$, the moment is denoted as t1, a moment at which a phase estimate is equal to $\pi$ is denoted as t2, and a time difference $\Delta t$ between the two moments is obtained through timing comparison. Then the phase difference $\Delta \theta$ is calculated based on a formula: $\Delta \theta = 2\pi \ast \Delta t/T$, where T is a cycle time of the input signal. In this optional solution, because the amplitude adjustment unit 701 needs to adjust an amplitude of the first voltage signal, but does not need to or cannot adjust a phase of the first voltage signal, the amplitude adjustment unit 701 does not necessarily need to be connected to the phase detector 7022. Therefore, a location of the amplitude adjustment unit 701 in the phase-locking apparatus 3024 may be shown in FIG. 15 or FIG. 16.

Step S803: The amplitude and phase detector outputs the amplitude difference to the first loop filter and outputs the phase difference to the second loop filter.

Step S804: The first loop filter filters the input amplitude difference to obtain an amplitude control amount, and the second loop filter filters the input phase difference to obtain a phase control amount.

Specifically, in a filtering process, precision control may be implemented by filtering out high-frequency interference, and speed control may be implemented by performing scaling processing on an amplitude or a phase. For example, the first loop filter is configured to filter out high-frequency interference from the input amplitude difference and perform scaling processing, to obtain the amplitude control amount; and the second loop filter is configured to filter out high-frequency interference from the input phase difference and perform scaling processing, to obtain the phase control amount. A PI adjustment principle may be used for both the first loop filter and the second loop filter. Optionally, a first parameter configured for the first loop filter is the same as that configured for the second loop filter (for example, the first parameter may include one or more of parameters such as a ratio parameter, a low frequency gain, and a cut-off frequency). A formula 1-10 shows an optional mathematical relationship between the amplitude difference $e_n$, and the amplitude control amount $d_m$, and between the phase difference $d_p$ and the phase control amount $e_p$.

$$\begin{bmatrix} d_m \\ d_p \end{bmatrix} = \left( K_p + \frac{K_i}{s} \right) \cdot \begin{bmatrix} e_m \\ e_p \end{bmatrix} \quad 1\text{-}10$$

where $K_p$ is a preset ratio parameter, $K_i$ is a preset integral parameter, and s is a complex frequency.

The first loop filter outputs the amplitude control amount to the first oscillator after obtaining the amplitude control amount, and the second loop filter outputs the phase control amount to the second oscillator after obtaining the phase control amount.

Step S805: The first oscillator converts the amplitude control amount output by the first loop filter to obtain the amplitude adjustment amount, and the second oscillator converts the phase control amount output by the second filter to obtain the phase estimate.

Specifically, the converting the amplitude control amount may include performing integral processing on the input amplitude control amount, and the converting the phase control amount may include performing integral processing on the input phase control amount. That is, an integral principle is used for both the first oscillator and the second oscillator. Optionally, a second parameter configured for the first oscillator is the same as that configured for the second oscillator (for example, the second parameter may include an integral coefficient). A formula 1-11 shows an optional mathematical relationship between the amplitude control amount $d_m$ and the amplitude adjustment amount $\theta_m$, and between the phase control amount $e_p$ and the phase adjustment amount $\theta_p$.

$$\begin{bmatrix} \theta_m \\ \theta_p \end{bmatrix} = \frac{1}{s} \cdot \begin{bmatrix} d_m \\ d_p \end{bmatrix} \qquad 1\text{-}11$$

It should be noted that the first parameter configured for the first loop filter may be the same as that configured for the second loop filter, and the second parameter configured for the first oscillator may be the same as that configured for the second oscillator; or the first parameter configured for the first loop filter may be the same as that configured for the second loop filter, but the second parameter configured for the first oscillator may be different from that configured for the second oscillator; or the first parameter configured for the first loop filter may be different from that configured for the second loop filter, but the second parameter configured for the first oscillator may be the same as that configured for the second oscillator; or the first parameter configured for the first loop filter may be different from that configured for the second loop filter, and the second parameter configured for the first oscillator may be different from that configured for the second oscillator. It can be understood that when the first parameter configured for the first loop filter is the same as that configured for the second loop filter, symmetry of the phase-locking apparatus can be further improved, and therefore frequency coupling can be further weakened; and when the second parameter configured for the first oscillator is the same as that configured for the second oscillator, symmetry of the phase-locking apparatus can be further improved, and therefore frequency coupling can be further weakened.

The following describes two main beneficial effects of the embodiments of this application relative to the prior art with reference to simulation diagrams.

1. Eliminate frequency coupling.

To verify a performance difference between a phase-locking apparatus of an asymmetric structure in the prior art and the phase-locking apparatus in this embodiment of this application in terms of frequency coupling, in a simulation process, a 300 Hz disturbance is added to a voltage at a PCC point, and an amplitude is 10% of a 50 Hz voltage.

Figure 17:
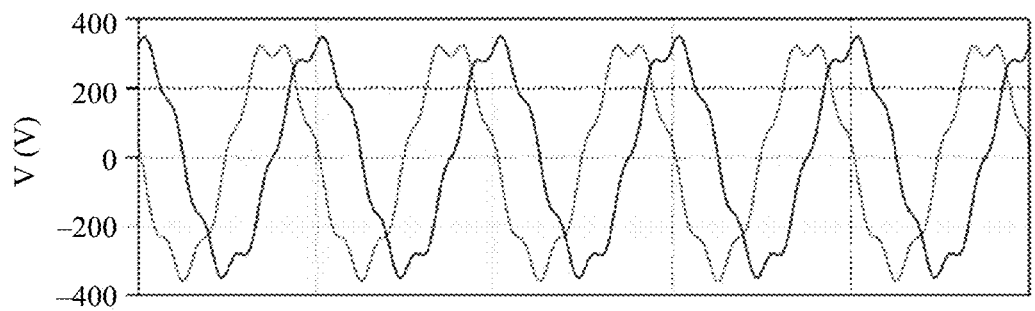
FIG. 17 is a voltage waveform diagram according to an embodiment of this application.
Figure 18:
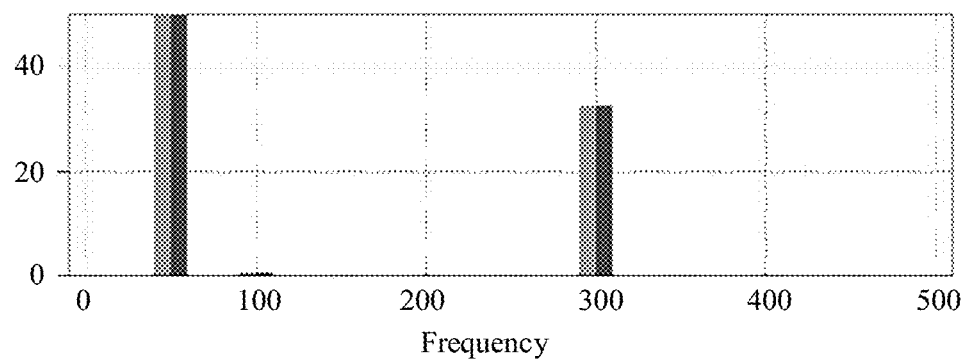
FIG. 18 is a voltage waveform diagram according to an embodiment of this application.

A waveform of a voltage, to which the disturbance has been added, at the PCC point is shown in FIG. 17. Two waveforms in FIG. 17 are waveforms of $v_\alpha$ and $v_\beta$ in a two-phase stationary reference frame. It can be learned that a time difference between the two voltage signals is ¼ of a utility frequency period (that is, a corresponding phase angle is 90°). In addition, there is an obvious harmonic component in the waveforms. As shown in FIG. 18, there are obvious 50 Hz and 300 Hz components.

Figure 19:
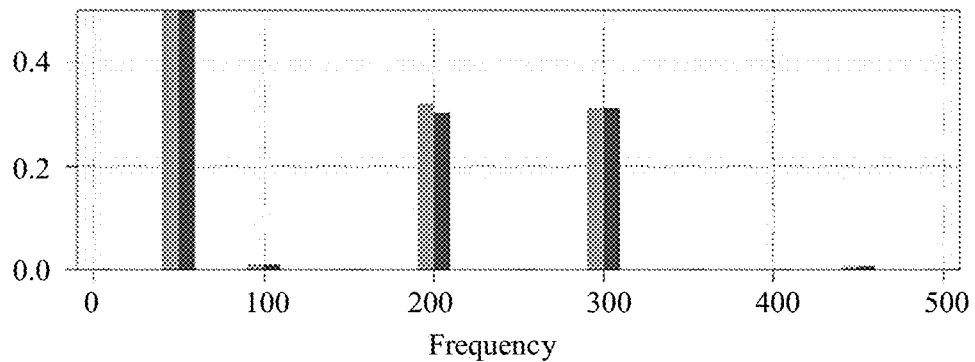
FIG. 19 is a current spectrum diagram according to an embodiment of this application.
Figure 20:
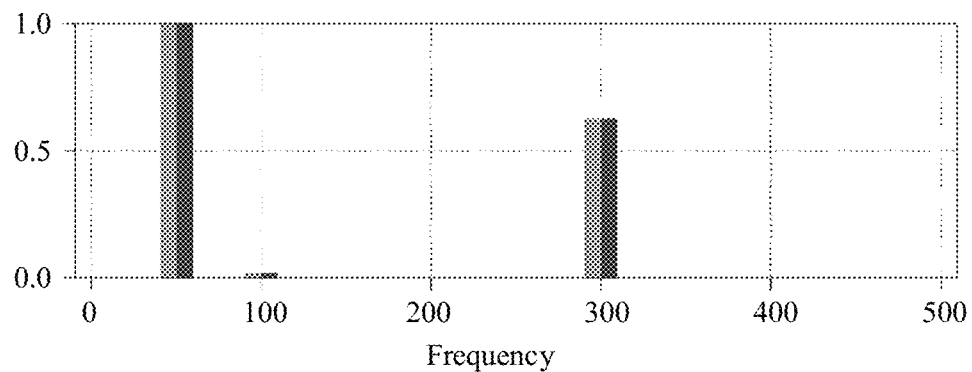
FIG. 20 is a current spectrum diagram according to an embodiment of this application.

The disturbance voltage is separately input to an inverter (grid-tied system) equipped with the phase-locking apparatus of the asymmetric structure and that equipped with the phase-locking apparatus in this embodiment of this application, and spectrum analysis is separately performed on output currents. Results are shown in FIG. 19 and FIG. 20. It can be learned from FIG. 19 that, in addition to the 50 Hz utility frequency component and the 300 Hz component corresponding to the original disturbance, a 200 Hz frequency component is added to the phase-locking apparatus of the asymmetric structure. This illustrates that the phase-locking apparatus has an obvious frequency coupling characteristic. Correspondingly, in FIG. 20, frequency components in the phase-locking apparatus of a dual-loop symmetric structure shown in this embodiment of this application only include 50 Hz and 300 Hz, which are the same as the frequency components of the voltage at the PCC point. This can illustrate that the phase-locking apparatus in this embodiment of this application eliminates a frequency coupling characteristic due to structural symmetry.

2. Provide a More Stable Voltage Signal for the Phase-Locking Apparatus.

To compare impact of amplitudes of input signals on different phase-locking apparatuses, two working conditions are set for each phase-locking apparatus. The amplitudes of the input signals are 100% and 70%, and when t=0.5 s, phases of the input signals jump by 30°. Impact of the amplitudes of the input signals on performance of different systems is compared by observing a dynamic response.

Figure 21:
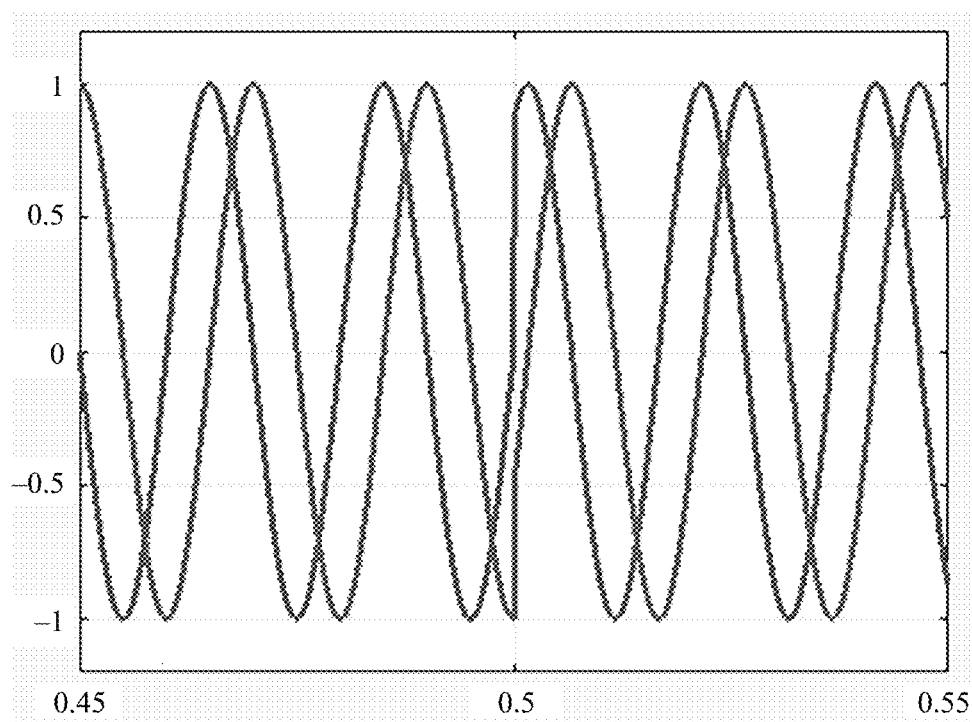
FIG. 21 is a simulation waveform diagram according to an embodiment of this application.
Figure 22:
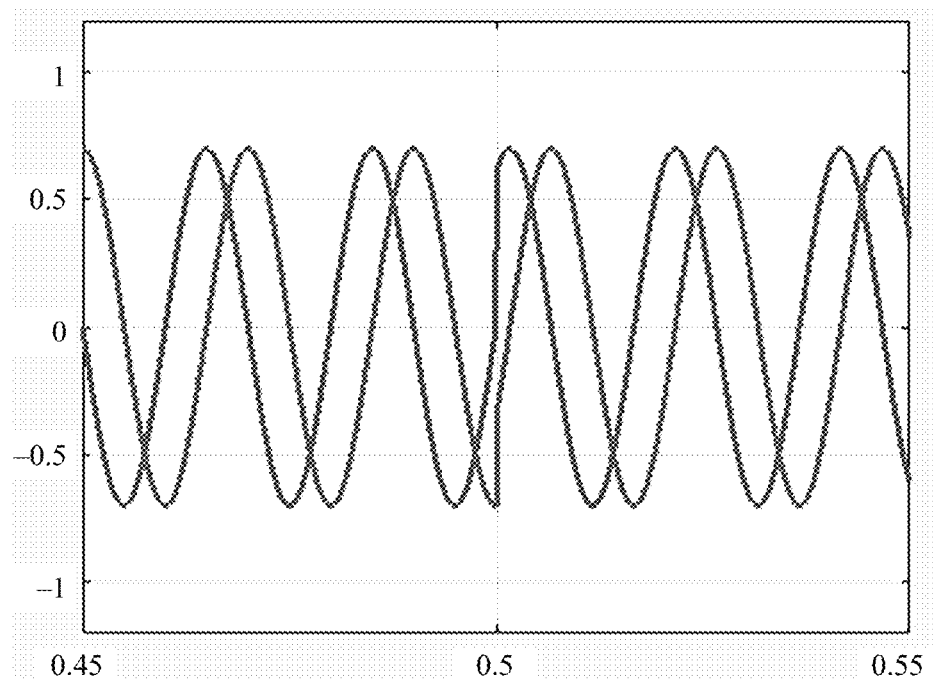
FIG. 22 is another simulation waveform diagram according to an embodiment of this application.
Figure 23:
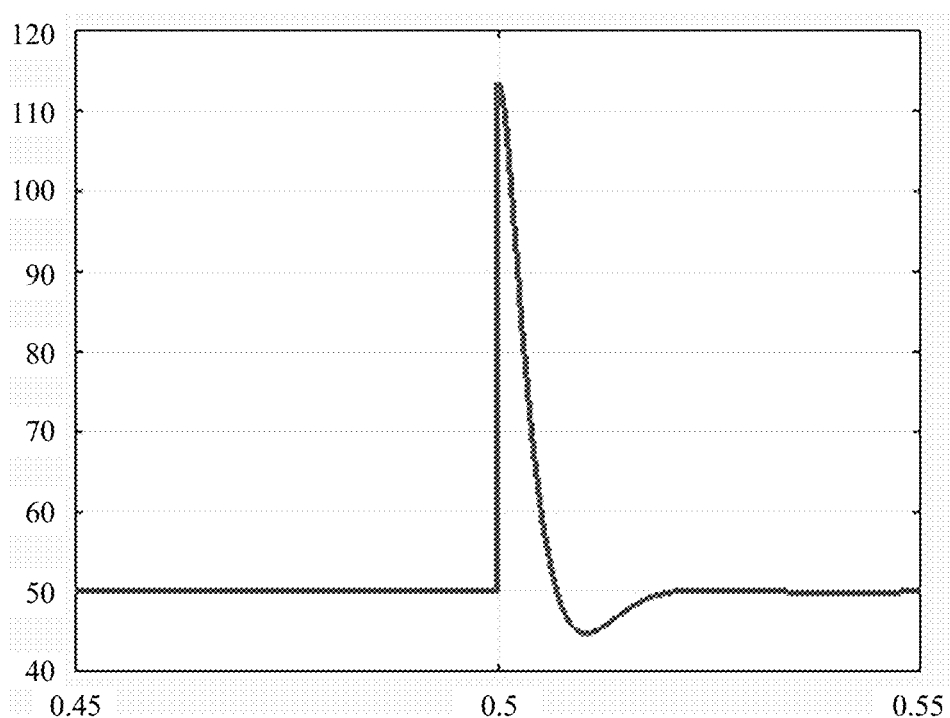
FIG. 23 is another simulation waveform diagram according to an embodiment of this application.
Figure 24:
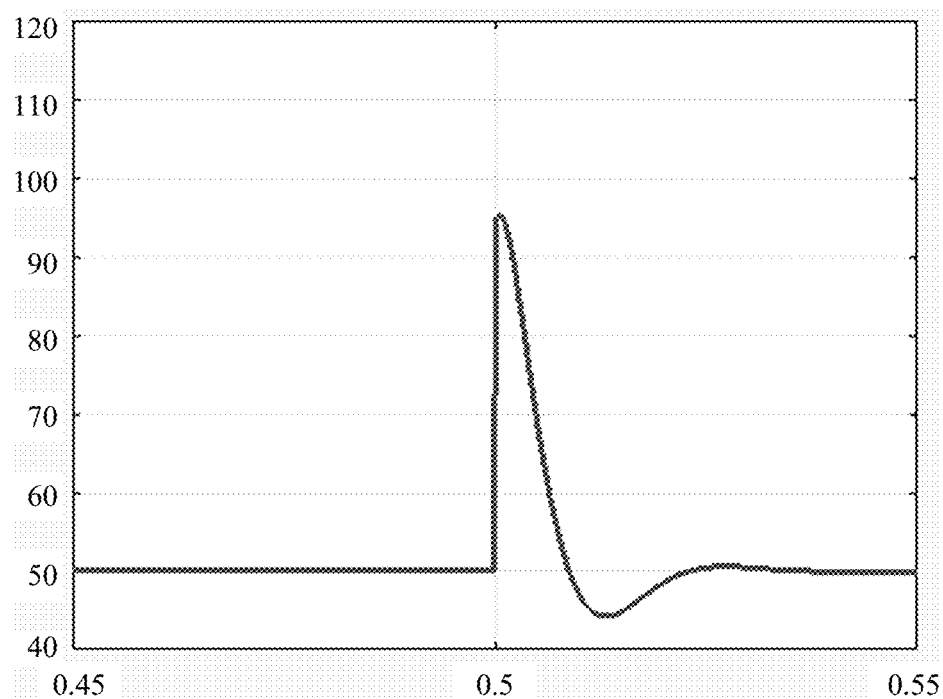
FIG. 24 is another simulation waveform diagram according to an embodiment of this application.

First, simulation waveforms for the existing asymmetric phase-locking apparatus are shown in FIG. 21, FIG. 22, FIG. 23, and FIG. 24. Because there is no amplitude compensation unit, an input signal of the phase-locking apparatus is the same as an input signal of the phase detector. FIG. 21 corresponds to $v_\alpha$ and $v_\beta$ in a 100% input signal working condition, and FIG. 22 corresponds to $v_\alpha$ and $v_\beta$ in a 70% input signal working condition. By comparing an output quantity change of a loop filter in the 100% input signal working condition shown in FIG. 23 with that in the 70% input signal working condition shown in FIG. 24, it can be learned that there is an obvious difference in a dynamic amplitude change of an output quantity of the loop filter in different input signal working conditions.

Figure 25:
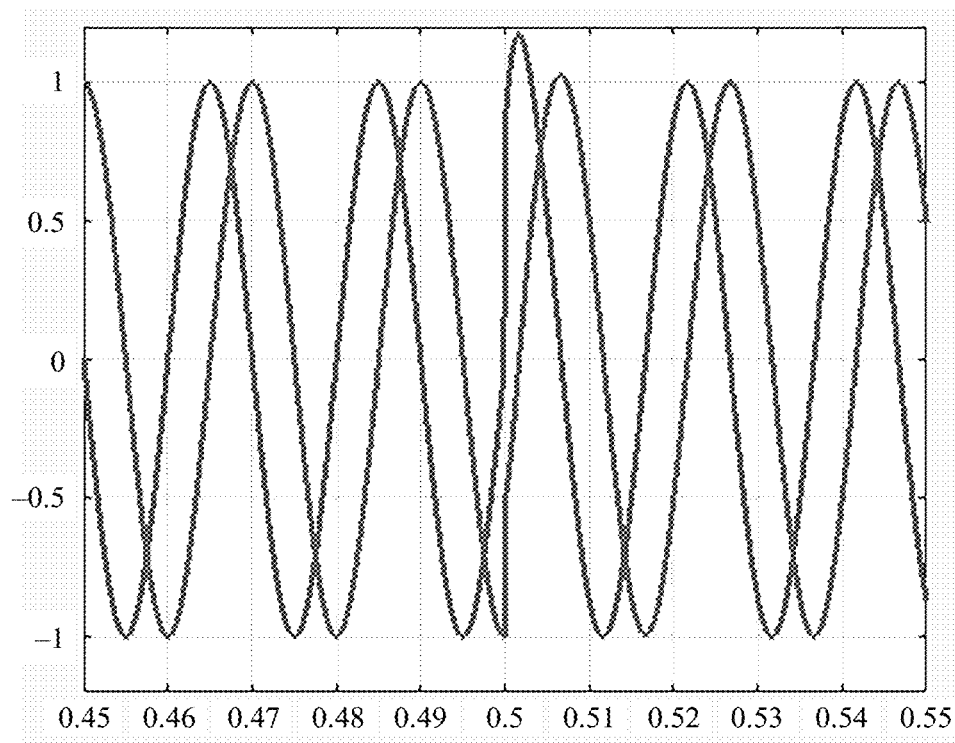
FIG. 25 is another simulation waveform diagram according to an embodiment of this application.
Figure 26:
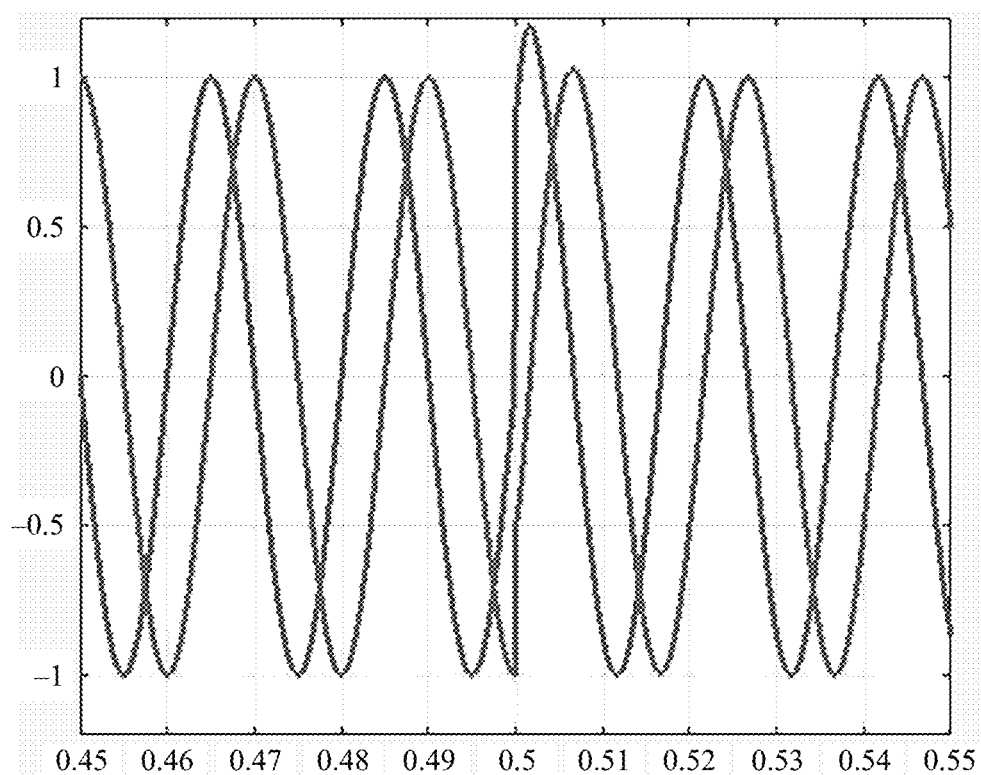
FIG. 26 is another simulation waveform diagram according to an embodiment of this application.
Figure 27:
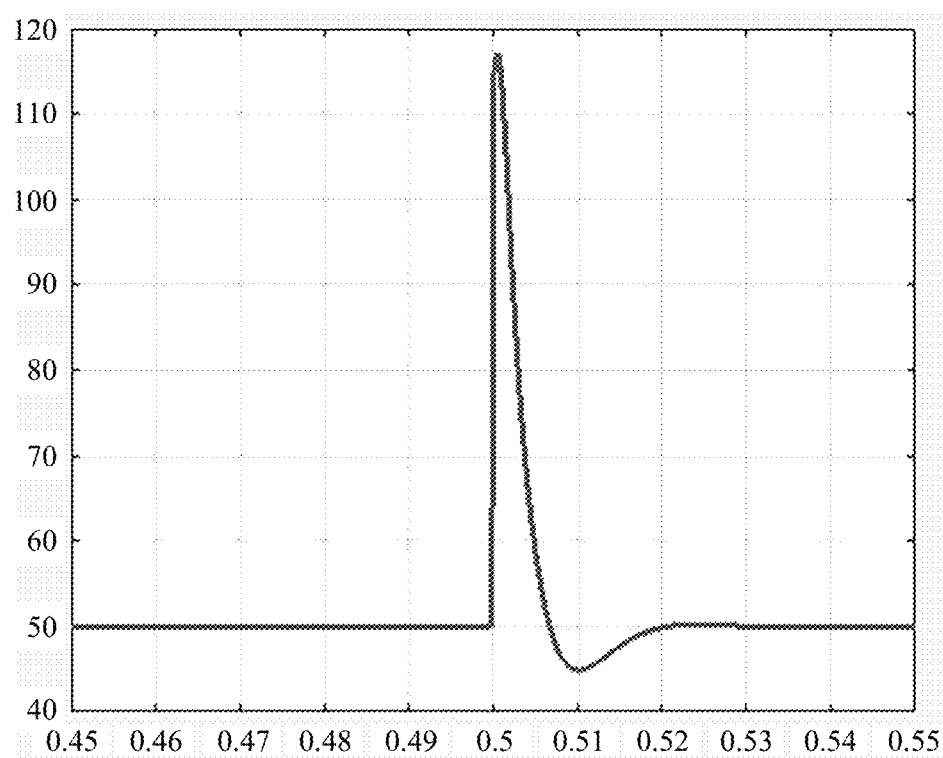
FIG. 27 is another simulation waveform diagram according to an embodiment of this application.
Figure 28:
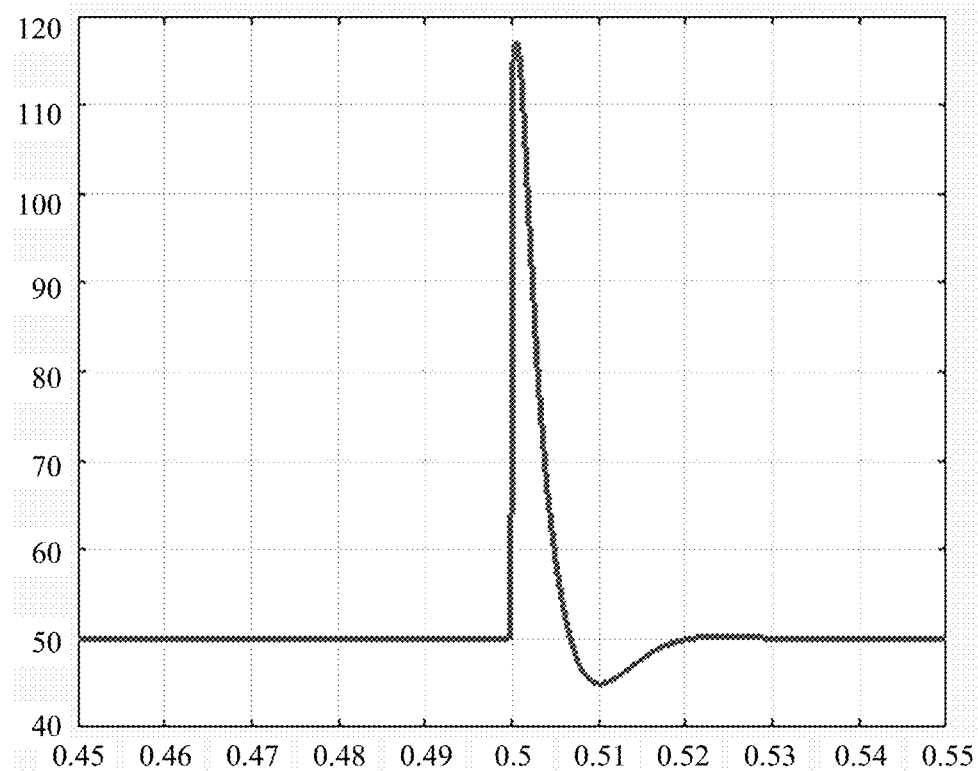
FIG. 28 is another simulation waveform diagram according to an embodiment of this application.

In addition, simulation waveforms for the phase-locking apparatus in this embodiment of this application are shown in FIG. 25, FIG. 26, FIG. 27, and FIG. 28. Because there is an amplitude adjustment loop, amplitudes of input signals of the amplitude and phase detector can be basically kept consistent through adjustment. FIG. 25 corresponds to $v_{\alpha o}$ and $v_{\beta o}$ in a 100% compensated input signal working condition, and FIG. 26 corresponds to $v_{\alpha o}$ and $v_{\beta o}$ in a 70% compensated input signal working condition. In the two working conditions, compensated amplitudes of the input signals are both 100% in a stable state. However, at an instant when a disturbance occurs in a system, because the amplitude adjustment loop of the phase-locking apparatus in this embodiment of this application requires a specific time for closed-loop adjustment, a compensated voltage is not equal to 100% in a short period of time. By comparing an output quantity change of a loop filter in the 100% compensated input signal working condition shown in FIG. 27 with that under the 70% compensated input signal shown in FIG. 28, it can be learned that dynamic amplitude changes of an output quantity of the loop filter are almost the same under different input signal working conditions.

It can be learned from the comparison that the phase-locking apparatus in this embodiment of this application can automatically compensate for an amplitude of a system input signal, thereby eliminating impact of an amplitude change of the input signal on performance of the phase-locking apparatus.

In conclusion, the amplitude adjustment unit, the amplitude and phase detector, the first loop filter, and the first oscillator form a loop of the phase-locking apparatus; and the amplitude and phase detector, the second loop filter, and the second oscillator form another loop of the phase-locking apparatus. The two loops of the phase-locking apparatus form a symmetric structure, and suppress generation of a negative-sequence component. Therefore, frequency coupling between a positive-sequence component generated by the phase-locking apparatus and a negative-sequence component generated by the phase-locking apparatus can be weakened. In addition, because the amplitude adjustment amount output by the first oscillator plays a feedback adjustment function on an amplitude of a voltage signal input to the phase-locking apparatus, an amplitude of a working voltage of the phase-locking apparatus can be kept relatively stable, thereby greatly improving working performance of the phase-locking apparatus.

Figure 29:
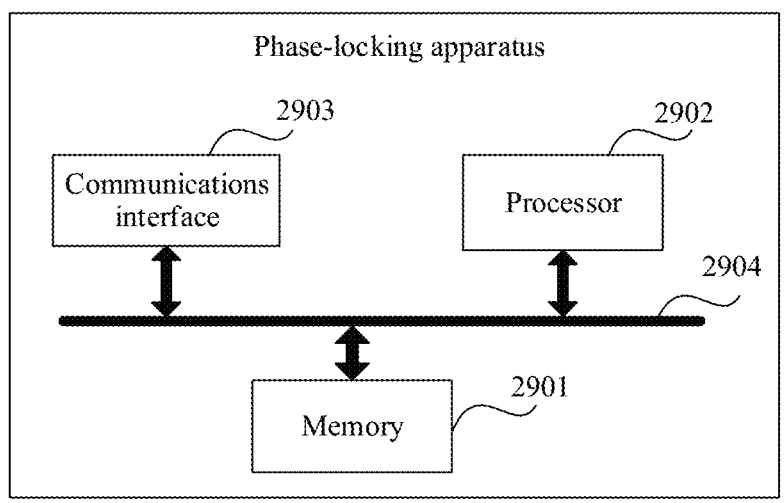
FIG. 29 is a schematic structural diagram of a phase-locking apparatus according to an embodiment of this application.

It should be noted that, among the amplitude adjustment unit, the amplitude and phase detector, the first loop filter, the second loop filter, the first oscillator, and the second oscillator that are included in the phase locking apparatus in this embodiment of this application, some units (or devices) may be implemented by using a hardware circuit, and some other units (or devices) are implemented by using software; or all the units (or devices) may be implemented by using a hardware circuit; or all the units (or devices) may be implemented by using software. When one (or more) unit (or device) is implemented by using software, the phase-locking apparatus includes a processor. The processor implements the one (or more) unit (or device) by running a program instruction. For example, if the amplitude adjustment unit is implemented by using software, the phase-locking apparatus may perform an amplitude adjustment task by running a program instruction. This is equivalent to obtaining the amplitude adjustment unit through virtualization based on the processor. It can be understood that, when all the units (or devices) are implemented by using software, a structure of the phase-locking apparatus may be shown in FIG. 29. As shown in FIG. 29, the phase-locking apparatus includes a memory 2901, a processor 2902, and a communications interface 2903. The processor 2902, the communications interface 2903, and the memory 2901 may be connected to each other, for example, connected to each other through a bus 2904. The memory 2901 is configured to store code and data of the phase-locking apparatus, for example, store code for implementing the amplitude adjustment unit, code for implementing the amplitude and phase detector, code for implementing the first loop filter, code for implementing the second loop filter, code for implementing the first oscillator, and code for implementing the second oscillator. By executing the code, the processor 2901 may obtain, through virtualization, function units such as the amplitude adjustment unit, the amplitude and phase detector, the first loop filter, the second loop filter, the first oscillator, and the second oscillator. In addition, the communications interface 2903 is configured to support signal transfer between the phase-locking apparatus and an external device. For example, the communications interface 2903 is configured to support inputting, to the phase-locking apparatus, an alternating-current voltage signal (v a, p) output by the voltage processing unit, and support the phase-locking apparatus in outputting a phase and an amplitude that are used for control to the current control unit or a voltage control unit.

In addition, the processor 2902 may be a central processing unit, a general-purpose processor, a digital signal processor, an application-specific integrated circuit, a field programmable gate array or another programmable logic device, a transistor logic device, a hardware component, or any combination thereof. The processor may implement or execute various example logical blocks, modules, and circuits described with reference to content disclosed in this application. Alternatively, the processor may be a combination of processors implementing a computing function, for example, a combination of one or more microprocessors, or a combination of the digital signal processor and a microprocessor. In addition, the memory may include any medium that can store program code, such as a ROM, a random access memory RAM, a magnetic disk, or an optical disc.

What is claimed is:

1. A phase-locking apparatus, comprising:
an amplitude adjuster,
an amplitude and phase detector connected to the amplitude adjuster,
a first loop filter connected to the amplitude and phase detector,
a second loop filter connected to the amplitude and phase detector,
a first oscillator connected to the first loop filter, and
a second oscillator connected to the second loop filter; wherein
the amplitude adjuster is configured to compensate for a first voltage signal based on an amplitude adjustment amount output by the first oscillator, to obtain a second voltage signal, wherein the first voltage signal is output from an alternating-current connection point configured to access an alternating-current system;
the amplitude and phase detector is configured to:
determine an amplitude difference based on the second voltage signal and a preset reference voltage amplitude, wherein the amplitude difference represents an offset of an amplitude of the second voltage signal relative to the preset reference voltage amplitude;
determine a phase difference based on the second voltage signal and a phase estimate output by the second oscillator, wherein the phase difference represents an offset of a phase of the second voltage signal relative to the phase estimate; and
output the amplitude difference to the first loop filter and the phase difference to the second loop filter;
the first loop filter is configured to filter the amplitude difference to obtain an amplitude control amount;
the second loop filter is configured to filter the phase difference to obtain a phase control amount;
the first oscillator is configured to convert the amplitude control amount output by the first loop filter to obtain the amplitude adjustment amount; and
the second oscillator is configured to convert the phase control amount output by the second loop filter to obtain the phase estimate.

2. The phase-locking apparatus according to claim 1, wherein the determine the amplitude difference and the determine the a phase difference comprises:
performing coordinate transformation on the second voltage signal based on the phase estimate output by the second oscillator, to obtain a direct-axis signal and a quadrature-axis signal in a rotating reference frame;
determining the amplitude difference based on the direct-axis signal and the preset reference voltage amplitude; and
determining the phase difference based on the quadrature-axis signal.

3. The phase-locking apparatus according to claim 1, wherein the amplitude and phase detector comprises an amplitude detector and a phase detector, and the determine the amplitude difference comprises:
extracting the amplitude of the second voltage signal; and
determining the amplitude difference based on the extracted amplitude and the preset reference voltage amplitude; and wherein
the determine the phase difference comprises:
extracting the phase of the second voltage signal or a phase of the first voltage signal; and determining the phase difference based on the extracted phase and the phase estimate output by the second oscillator.

4. The phase-locking apparatus according to claim 1, wherein
one more of a ratio parameter, a low frequency gain, a cut-off frequency, or an integral coefficient configured for the first loop filter is the same as that configured for the second loop filter and the second loop filter are same.

5. The phase-locking apparatus according to claim 1, wherein the first voltage signal is in a two-phase stationary reference frame and is obtained by transforming three phase voltages collected at the alternating-current connection point.

6. The phase-locking apparatus according to claim 1, wherein the first voltage signal is an voltage signal in a two-phase stationary reference frame and is obtained by superposing two voltage signals into which a single phase voltage collected at the alternating-current connection point is split, wherein one of the two voltage signals has undergone delay processing with a delay duration that is ¼ of a utility frequency period.

7. The phase-locking apparatus according to claim 1, wherein the first voltage signal or the second voltage signal is a positive-sequence component obtained through positive-sequence extraction.

8. The phase-locking apparatus according to claim 1, wherein a ratio of the first voltage signal to the second voltage signal is in an exponential function relationship or a linear function relationship with the amplitude control amount output by the first oscillator.

9. The phase-locking apparatus according to claim 1, wherein the filter the input amplitude difference comprises:
filtering out high-frequency interference from the input amplitude difference; and
performing scaling processing, to obtain the amplitude control amount; and wherein
the filter the phase difference comprises filtering out high-frequency interference from the phase difference and perform scaling processing, to obtain the phase control amount.

10. A phase-locking method, comprising:
compensating, by an amplitude adjuster for a first voltage signal based on an amplitude adjustment amount output by a first oscillator, to obtain a second voltage signal, wherein the first voltage signal is output from an alternating-current connection point configured to access an alternating-current system;
determining, by an amplitude and phase detector, an amplitude difference based on the second voltage signal and a preset reference voltage amplitude, wherein the amplitude difference represents an offset of an amplitude of the second voltage signal relative to the preset reference voltage amplitude;
determining, by the amplitude and phase detector, a phase difference based on the second voltage signal and a phase estimate output by the second oscillator, wherein the phase difference represents an offset of a phase of the second voltage signal relative to the phase estimate;
outputting, by the amplitude and phase detector, the amplitude difference to a first loop filter;
outputting the phase difference to a second loop filter;
filtering, by the first loop filter, the input amplitude difference to obtain an amplitude control amount;
filtering, by the second loop filter, the phase difference to obtain a phase control amount;

converting, by the first oscillator, the amplitude control amount output by the first loop filter to obtain the amplitude adjustment amount; and
converting, by the second oscillator, the phase control amount output by the second filter to obtain the phase estimate.

11. The method according to claim 10, wherein the determining an amplitude difference based on the second voltage signal and a preset reference voltage amplitude, and determining a phase difference based on the second voltage signal and a phase estimate output by the second oscillator comprises:
performing coordinate transformation on the second voltage signal based on the phase estimate output by the second oscillator, to obtain a direct-axis signal and a quadrature-axis signal in a rotating reference frame; and
determining the amplitude difference based on the direct-axis signal and the preset reference voltage amplitude; and determining the phase difference based on the quadrature-axis signal.

12. The method according to claim 10, wherein the determining the amplitude difference comprises:
extracting the amplitude of the second voltage signal; and
determining the amplitude difference based on the extracted amplitude and the preset reference voltage amplitude; and wherein
the determining the phase difference comprises:
extracting the phase of the second voltage signal or a phase of the first voltage signal; and
determining the phase difference based on the extracted phase and the phase estimate output by the second oscillator.

13. The method according to claim 10, wherein
one more of a ratio parameter, a low frequency gain, a cut-off frequency, or an integral coefficient configured for the first loop filter and the second loop filter are same.

14. The method according to claim 10, wherein the first voltage signal is in a two-phase stationary reference frame and is obtained by transforming three phase voltages collected at the alternating-current connection point.

15. The method according to claim 10, wherein the first voltage signal is an voltage signal in a two-phase stationary reference frame and is obtained by superposing two voltage signals into which a single phase voltage collected at the alternating-current connection point is split, wherein one of the two voltage signals has undergone delay processing with a delay duration that is ¼ of a utility frequency period.

16. The method according to claim 10, wherein the first voltage signal or the second voltage signal is a positive-sequence component obtained through positive-sequence extraction.

17. The method according to claim 10, wherein a ratio of the first voltage signal to the second voltage signal is in an exponential function relationship or a linear function relationship with the amplitude control amount output by the first oscillator.

18. The method according to claim 10, wherein the filtering the input amplitude difference comprises
filtering out high-frequency interference from the input amplitude difference and performing scaling processing, to obtain the amplitude control amount; and
filtering the phase difference comprises filtering out high-frequency interference from the phase difference and performing scaling processing, to obtain the phase control amount.

19. A controller, wherein the controller comprises:
a phase-locking apparatus and a current controller, the phase-locking apparatus comprising:
an amplitude adjuster,
an amplitude and phase detector connected to the amplitude adjuster,
a first loop filter connected to the amplitude and phase detector,
a second loop filter connected to the amplitude and phase detector,
a first oscillator connected to the first loop filter, and
a second oscillator connected to the second loop filter; wherein
the amplitude adjuster is configured to compensate for a first voltage signal based on an amplitude adjustment amount output by the first oscillator, to obtain a second voltage signal, wherein the first voltage signal is output from an alternating-current connection point configured to access an alternating-current system;
the amplitude and phase detector is configured to:
determine an amplitude difference based on the second voltage signal and a preset reference voltage amplitude, wherein the amplitude difference represents an offset of an amplitude of the second voltage signal relative to the preset reference voltage amplitude;
determine a phase difference based on the second voltage signal and a phase estimate output by the second oscillator, wherein the phase difference represents an offset of a phase of the second voltage signal relative to the phase estimate; and
output the amplitude difference to the first loop filter and the phase difference to the second loop filter;
the first loop filter is configured to filter the amplitude difference to obtain an amplitude control amount;
the second loop filter is configured to filter the phase difference to obtain a phase control amount;
the first oscillator is configured to convert the amplitude control amount output by the first loop filter to obtain the amplitude adjustment amount; and
the second oscillator is configured to convert the phase control amount output by the second loop filter to obtain the phase estimate; and
the current controller is configured to output a control signal based on a phase parameter output by the phase-locking apparatus, wherein the control signal controls an alternating-current/direct-current converter to perform power conversion.

20. A grid-tied system, comprising an alternating-current/direct-current converter, and a controller connected to the alternating-current/direct-current converter, wherein the controller comprises:
a phase-locking apparatus and a current controller, the phase-locking apparatus comprising:
an amplitude adjuster,
an amplitude and phase detector connected to the amplitude adjuster,
a first loop filter connected to the amplitude and phase detector,
a second loop filter connected to the amplitude and phase detector,
a first oscillator connected to the first loop filter, and
a second oscillator connected to the second loop filter; wherein
the amplitude adjuster is configured to compensate for a first voltage signal based on an amplitude adjustment amount output by the first oscillator, to obtain a second voltage signal, wherein the first voltage signal is output from an alternating-current connection point configured to access an alternating-current system;
the amplitude and phase detector is configured to:
determine an amplitude difference based on the second voltage signal and a preset reference voltage amplitude, wherein the amplitude difference represents an offset of an amplitude of the second voltage signal relative to the preset reference voltage amplitude;
determine a phase difference based on the second voltage signal and a phase estimate output by the second oscillator, wherein the phase difference represents an offset of a phase of the second voltage signal relative to the phase estimate; and
output the amplitude difference to the first loop filter and the phase difference to the second loop filter;
the first loop filter is configured to filter the amplitude difference to obtain an amplitude control amount;
the second loop filter is configured to filter the phase difference to obtain a phase control amount;
the first oscillator is configured to convert the amplitude control amount output by the first loop filter to obtain the amplitude adjustment amount; and
the second oscillator is configured to convert the phase control amount output by the second loop filter to obtain the phase estimate; and
the current controller is configured to control the alternating-current/direct-current converter to perform power conversion based on a phase parameter output by the phase-locking apparatus.

* * * * *